United States Patent
Bailey et al.

(10) Patent No.: US 9,445,534 B2
(45) Date of Patent: Sep. 13, 2016

(54) COMPUTE DEVICE CASING THAT DOUBLES AS PACKAGING AND SHIPPING CONTAINER FOR THE COMPUTE DEVICE

(71) Applicant: DELL PRODUCTS, L.P., Round Rock, TX (US)

(72) Inventors: Edmond I. Bailey, Cedar Park, TX (US); Walter Carver, Round Rock, TX (US); Steven Embleton, Austin, TX (US)

(73) Assignee: DELL PRODUCTS, L.P., Round Rock, TX (US)

( * ) Notice: Subject to any disclaimer, the term of this patent is extended or adjusted under 35 U.S.C. 154(b) by 225 days.

(21) Appl. No.: 14/299,182

(22) Filed: Jun. 9, 2014

(65) Prior Publication Data

US 2015/0359146 A1 Dec. 10, 2015

(51) Int. Cl.
H05K 7/00 (2006.01)
H05K 9/00 (2006.01)
H01L 23/473 (2006.01)
H05K 7/14 (2006.01)

(52) U.S. Cl.
CPC ........... *H05K 9/0007* (2013.01); *H01L 23/473* (2013.01); *H05K 7/1487* (2013.01); *H05K 9/0062* (2013.01); *H05K 9/0067* (2013.01); *H01L 2924/0002* (2013.01)

(58) Field of Classification Search
USPC ................ 361/728, 679.01, 679.02; 174/377
See application file for complete search history.

(56) References Cited

U.S. PATENT DOCUMENTS

| | | |
|---|---|---|
| 5,303,820 A | 4/1994 | Comtois |
| 5,590,781 A | 1/1997 | Shackelford et al. |
| 6,305,539 B1 | 10/2001 | Sanders, Jr. |
| 6,425,648 B1 | 7/2002 | Notohardjono et al. |
| 7,628,271 B1 | 12/2009 | Marton |
| 7,874,433 B2 | 1/2011 | Levesque et al. |
| 8,413,833 B1 | 4/2013 | Taylor et al. |
| 8,424,691 B2 | 4/2013 | McMillan |
| 2002/0144032 A1 | 10/2002 | Kriege et al. |
| 2003/0041409 A1 | 3/2003 | Caporale |
| 2003/0221914 A1 | 12/2003 | Smith et al. |
| 2007/0187836 A1* | 8/2007 | Lyne ............... H01L 25/0657 257/777 |
| 2007/0228900 A1 | 10/2007 | Cheng et al. |
| 2008/0236099 A1 | 10/2008 | Goel et al. |
| 2012/0153785 A1 | 6/2012 | Lai et al. |
| 2012/0229971 A1* | 9/2012 | Mills ............... H05K 7/1489 361/679.46 |

OTHER PUBLICATIONS

ISA/US, International Application No. PCT/US14/72035, International Search Report and Written Opinion, Apr. 1, 2015.

* cited by examiner

*Primary Examiner* — Andargie M Aychillhum
(74) *Attorney, Agent, or Firm* — Isidore PLLC

(57) ABSTRACT

An information handling system (IHS) when operational has compute components held by a lightweight server (LWS) chassis. For both shipping and operational support, the LWS chassis is inserted into a casing that is laterally sized to prevent lateral movement of the server chassis. The casing is formed of an impact tolerant material to protect the server chassis and any functional compute components inserted within the server chassis. In addition, the casing has sealable flaps that enable the server chassis to be fully enclosed within the casing. Thereby, the casing can be utilized as an external shipping carton in which the IHS can be physically shipped to a destination.

12 Claims, 24 Drawing Sheets

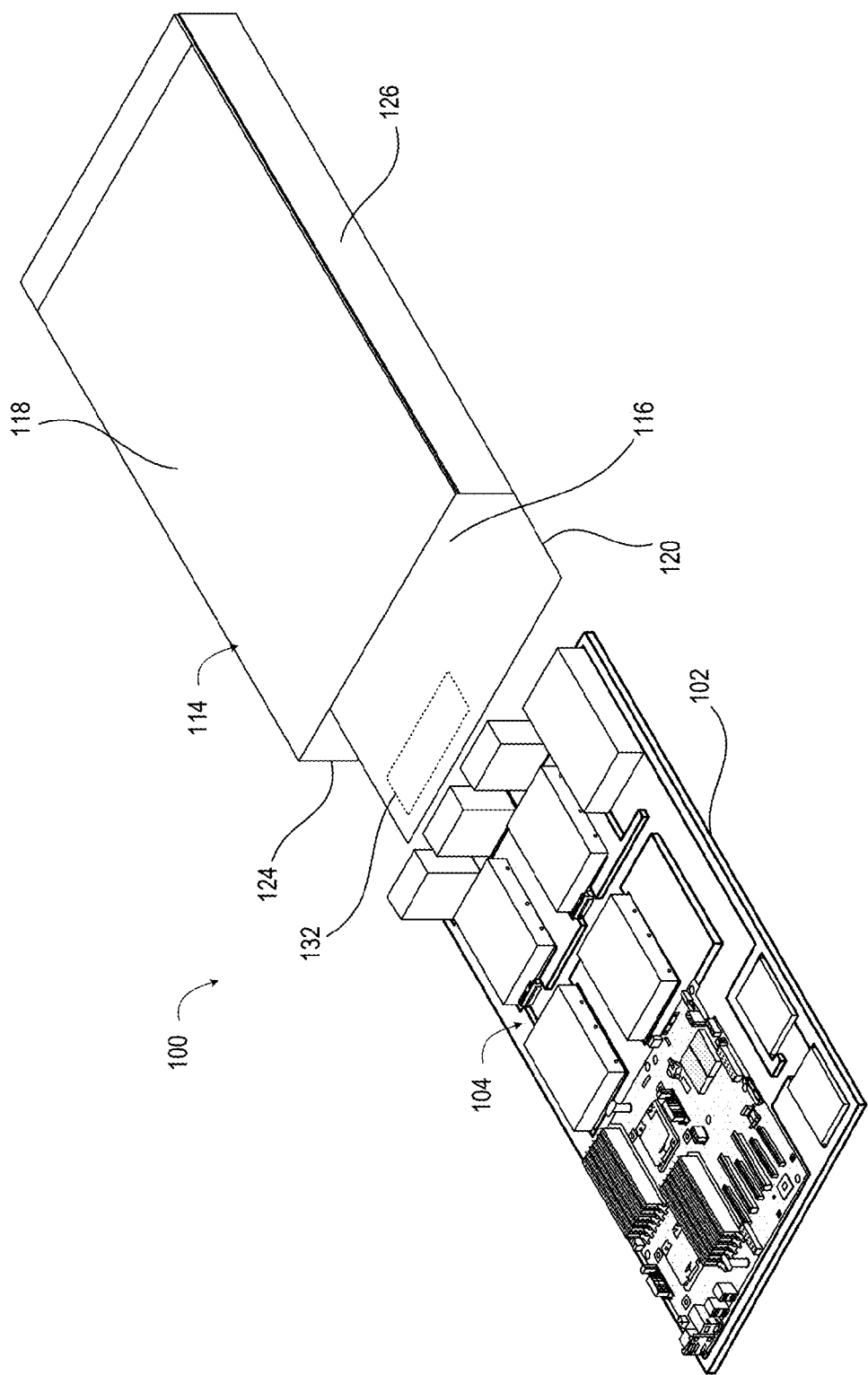

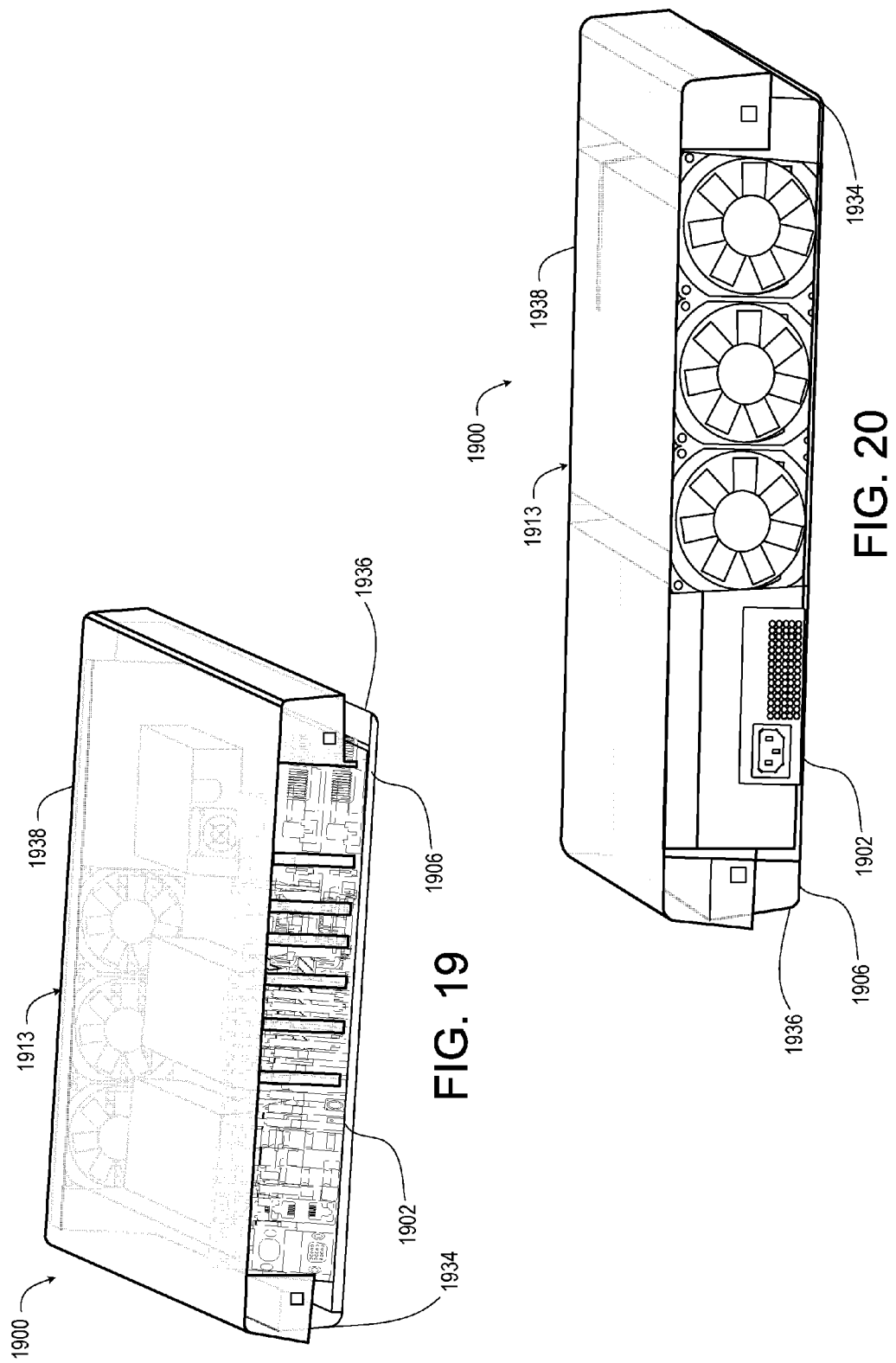

COMPUTE DEVICE CASING THAT DOUBLES AS PACKAGING AND SHIPPING CONTAINER FOR THE COMPUTE DEVICE

BACKGROUND

1. Technical Field

This disclosure generally relates to information handling systems (IHS), and more particular to a dual use casing that protects compute components of an IHS and serves as a shipping container for the IHS.

2. Description of the Related Art

As the value and use of information continue to increase, individuals and businesses seek additional ways to process and store information. One option available to users is information handling systems (IHSs). An IHS generally processes, compiles, stores, and/or communicates information or data for business, personal, or other purposes, thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

Information handling systems typically include a number of compute components that are placed on a chassis. The chassis is then inserted and/or affixed within an exterior casing that is typically made of sheet metal formed to hold the chassis and other components of the information handling system. With both server IHSes and personal compute system, customers frequently order the units from the manufacturer or distributor or retailer, and the units are shipped to the end customer via a shipping service (e.g., US mail or United Postal Service, or FedEx). Shipment of these IHSes involves packaging the units in a shipping container, such as a cardboard box or crate. To allow for shipping of these units to the end customers, the manufacturer and/or distributor of the IHSes thus have to package the manufactured IHSes, complete with computer modules, chassis and exterior casing, into shippable containers and then ship the packaged complete IHSes to the retailer or end customer. The retailer or end customer may also package the received package for further shipment to another location, adding another layer of shipping container/packaging around the IHS. Once received by the final end customer, that customer then has to unpack the unit and discard the one or more packing container/s.

With end customers that maintain large scale server farms and who require a large number of these IHSes that are rack-mounted and/or plugged into these server farms in a closed environment, the amount of packaging waste generated can be substantial. Also, these end customers requiring large scale deployment of server IHSes do not really care about the packaging of the servers, as the servers are viewed simply as modular compute units for insertion into the large server farm that is typically hidden away behind or within an IT infrastructure.

BRIEF SUMMARY

The illustrative embodiments of the present disclosure provide an information handling system (IHS) having a lightweight server (LWS) chassis and a casing in which the LWS chassis is inserted. The casing is sized for closely receiving the server chassis to prevent lateral movement of the server chassis within the casing. The casing is formed of an impact tolerant material to protect the server chassis and any functional compute components inserted within the server chassis. In addition, the casing has sealable flaps that enable the server chassis to be fully enclosed within the casing. The casing includes at least one surface to which addressing information and/or postage can be affixed. The casing doubles as an external shipping carton in which the IHS can be physically shipped to a destination. Once at the destination, that IHS can be plugged in, inserted into a rack, and/or utilized as a server without having to remove the majority of casing.

According to at least one aspect of the present disclosure, a method is provided for enclosing the chassis of an IHS in an external casing that is utilized for both shipping and operationally supporting an IHS. The method includes providing a LWS chassis. The method includes providing a casing that is sized for closely receiving the server chassis to prevent lateral movement of the server chassis within the casing. The casing is formed of an impact tolerant material to protect the server chassis and any functional compute components inserted within the server chassis. The method includes inserting the LWS chassis with attached/inserted compute components into the casing. The method further includes fully enclosing the LWS chassis within the casing using sealable flaps of the casing. The method further includes providing shipping label attachment locations on the exterior of the casing such that the casing can be utilized as an external shipping carton in which the IHS is physically shipped to a destination.

The above presents a general summary of several aspects of the disclosure in order to provide a basic understanding of at least some aspects of the disclosure. The above summary contains simplifications, generalizations and omissions of detail and is not intended as a comprehensive description of the claimed subject matter but, rather, is intended to provide a brief overview of some of the functionality associated therewith. The summary is not intended to delineate the scope of the claims, and the summary merely presents some concepts of the disclosure in a general form as a prelude to the more detailed description that follows. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which:

FIG. 5 illustrates an isometric view of the assembled compute components and LWS chassis of FIG. 3 and a partially assembled casing of FIG. 4, according to one embodiment;

FIG. 19 illustrates a front isometric view of an additional example rack server having a LWS chassis, according to one embodiment;

FIG. 20 illustrates a rear isometric view of the additional example rack server having a LWS chassis of FIG. 19, according to one embodiment;

DETAILED DESCRIPTION

Figure 1:
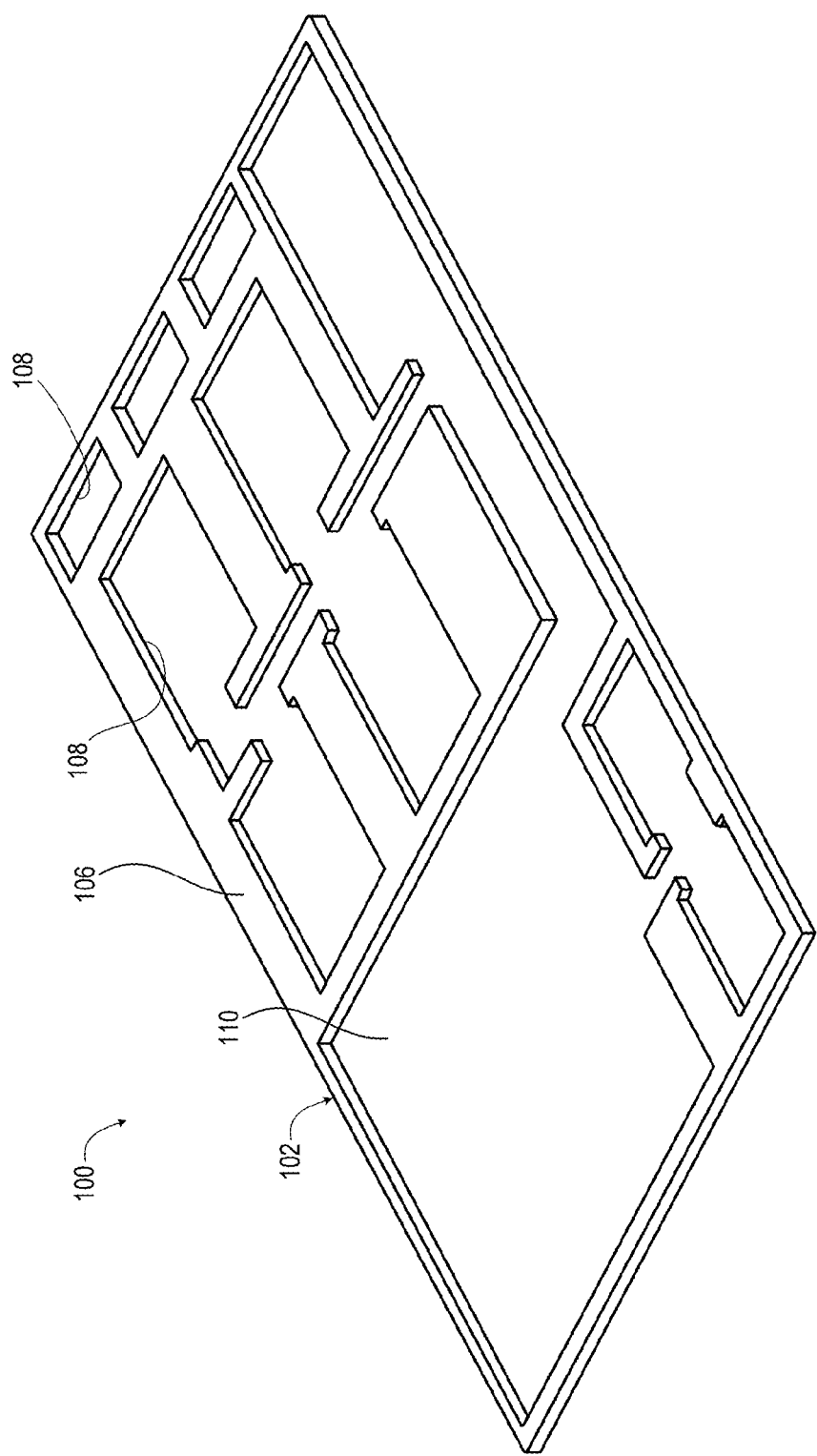
FIG. 1 illustrates an isometric view of an example LWS chassis within which various aspects of the disclosure can be implemented, according to one or more embodiments.

The present disclosure provides an information handling system (IHS) having a lightweight server (LSW) chassis that is configured for modular insertion of compute components. The chassis is made of a lightweight material and is configured with receiving slots in which different functional compute components of an IHS can be fitted (or snapped in) and held in place. A casing encompasses the chassis with the compute components to provide protection as packaging during shipping. In one embodiment, the casing includes features to protect from damage due to impact or electrical hazards. Removable portions of the casing allow the remainder of the casing to continue to be utilized to protect the chassis and compute components while providing access for power, cooling, and communication cabling during operational use of the IHS.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others.

Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

Figure 2:
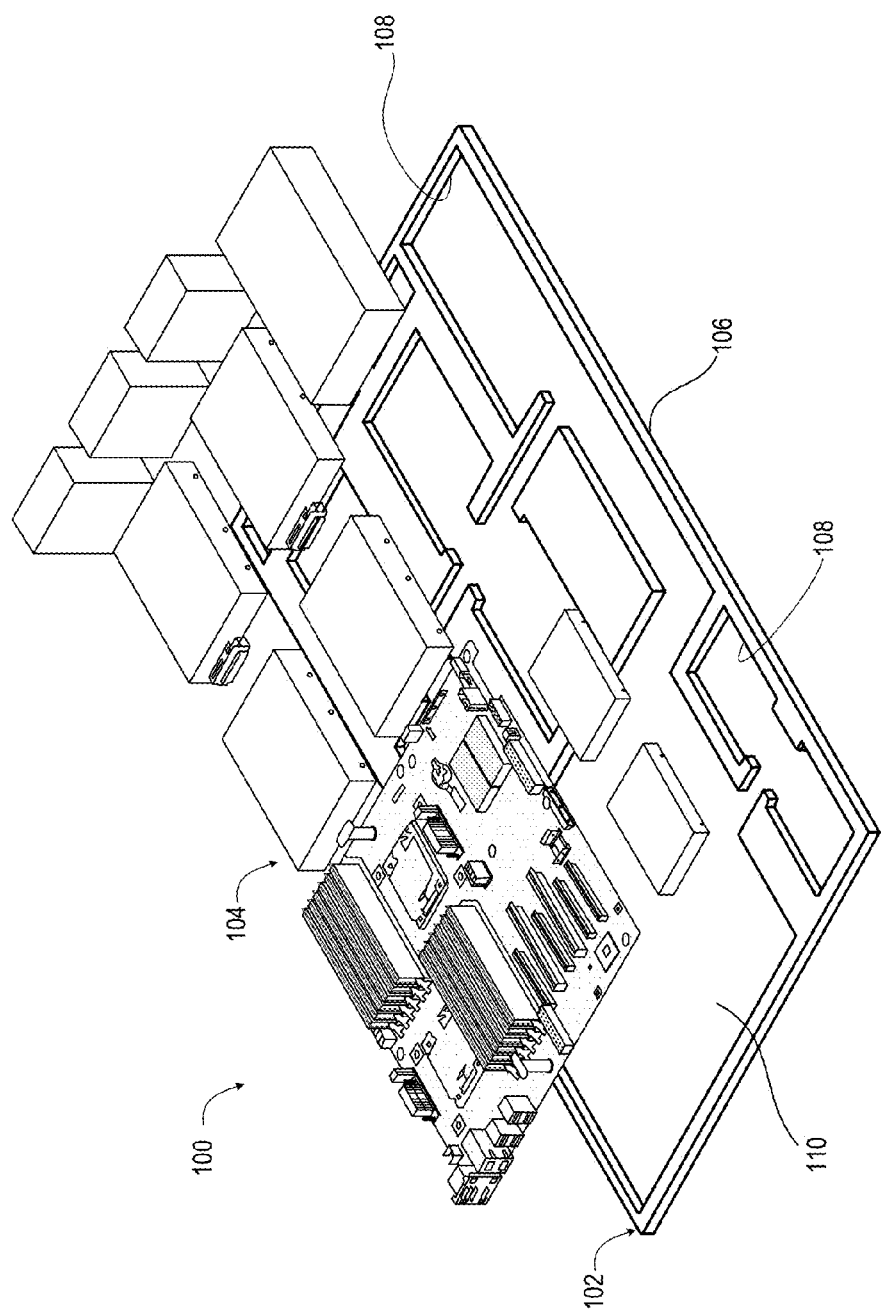
FIG. 2 illustrates an isometric view of the LWS chassis of FIG. 1 with an exploded view of modular, functional compute components, according to one embodiment.
Figure 3:
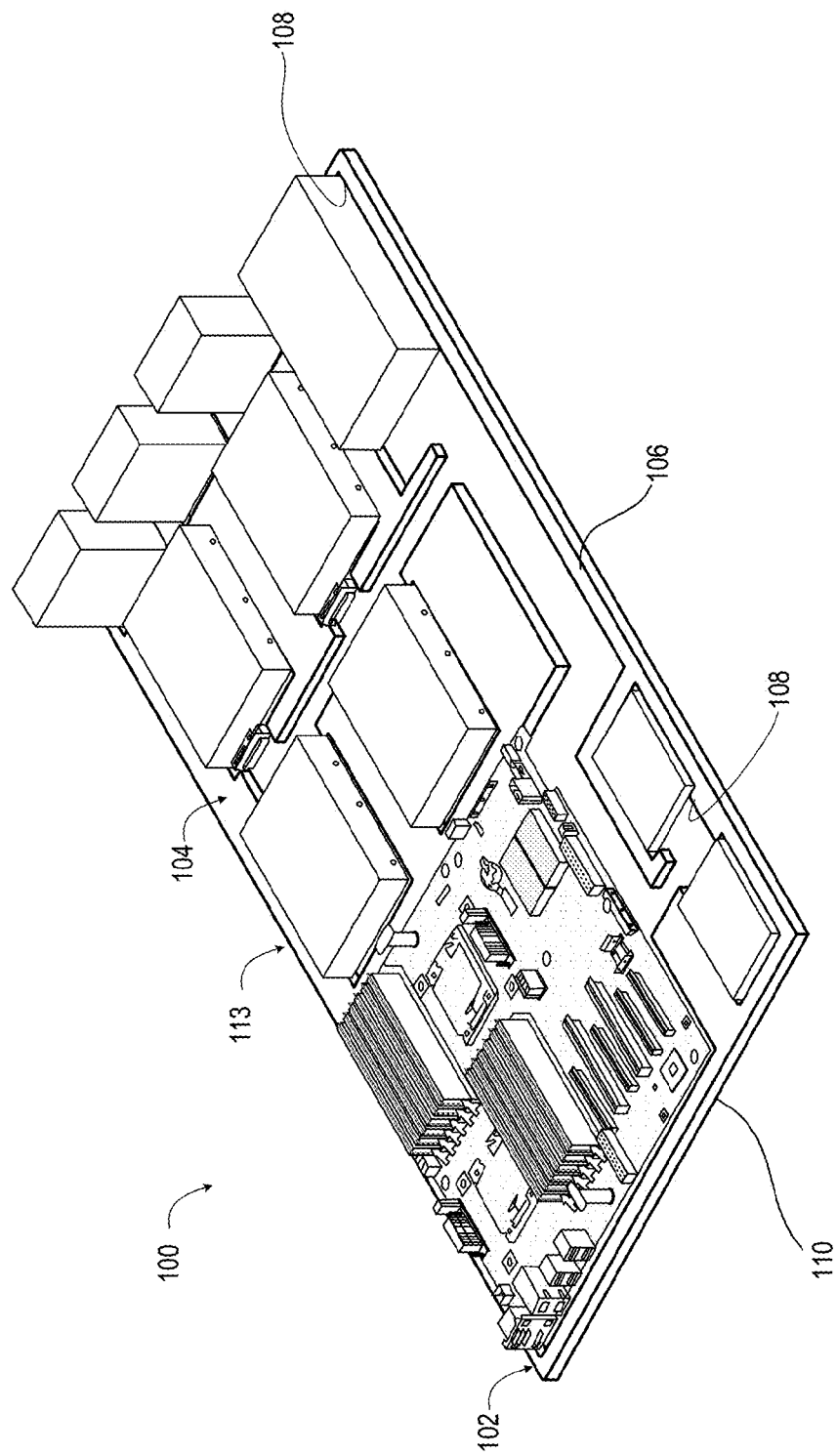
FIG. 3 illustrates an isometric view of the modular, functional compute components engageably received by the LWS chassis of FIG. 2, according to one embodiment.

FIGS. 1-3 illustrate at least a portion of an IHS 100 that includes LWS chassis 102 that receives modular, functional compute components 104 (FIGS. 2-3). FIG. 1 illustrates an example LWS chassis 102 within which various aspects of the disclosure can be implemented, according to one or more embodiments. FIG. 2 illustrates the LWS chassis 102 with the modular, functional compute components 104 disassembled from the LWS chassis 102. FIG. 3 illustrates the modular, functional compute components 104 engageably received by the LWS chassis 102. The LWS chassis 102 provides structural rigidity to maintain shape during shipping and during functional use after shipping. For example, the material incorporated into the LWS chassis 102 can withstand static weight loads, expected moisture exposure, expected temperature range exposure, expected vibration and impact loads, etc.

The LWS chassis 102 can serve as a base component 106 of the structural support for these compute components 104 during both shipping of the IHS 100 and usage at a final destination. In one embodiment, the LWS chassis 102 has a top surface 108 that includes slots 110 formed therein that are each sized to receive a specific compute component 104 of a plurality of different compute components 104 that collectively provide a fully functional IHS 100. Examples of configurable compute components that can be part of the IHS 100 include but are not limited to redundant and nonredundant power supply units, solid state data storage, optical disk data storage, tape drive, hard disk drives, motherboard optionally configured with modules such as a second processor, fan cooling, networking controllers, expansion boards, and user interface modules. In a particular embodiment, the LWS chassis 102 is formed of a pliable material into which is molded receptacles 112. The receptacles 112 define engageable surfaces of the slots 110 presented on the top surface 108 thereof. In one embodiment, the molded receptacles 112 are sized to selectively receive more than one type of compute component 104, thereby providing configurability at either the original equipment manufacturer (OEM) or at a final end customer or end destination at which the IHS 100 is assembled and/or utilized.

In one embodiment, the LWS chassis 102 can be formed of material that is biodegradable for facilitating disposal at the end of life of the corresponding IHS 100. In one embodiment, the LWS chassis 102 can incorporate or be selectively coated with material that is flame retardant and heat resistant to mitigate hazards from compute components 104 that can reach high temperatures. In one embodiment, the LWS chassis 102 incorporates shielding material for shielding a user from electromagnetic interference (EMI) generated by the modular, functional compute components 104 and shielding the modular functional compute components 104 from electrostatic damage.

When the compute components 104 are operationally connected, such as by standard cabling, the compute components 104 can perform as at least a portion of the IHS 100, and can provide a rack server 113 (FIG. 3). According to various embodiments, an IHS 100 may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an IHS 100 may be a handheld device, personal computer, a server, a network storage device, or any other suitable device and may vary in size, shape, performance, functionality, and price. The IHS 100 may include random access memory (RAM), one or more processing resources such as a central processing unit (CPU) or hardware or software control logic, read only memory (ROM), and/or other types of nonvolatile memory. Additional components of the IHS 100 may include one or more disk drives, one or more network ports for communicating with external devices as well as various input and output (I/O) devices, such as a keyboard, a mouse, and a video display. The IHS 100 may also include one or more buses operable to transmit communications between the various hardware components.

FIGS. 4A, 4B, 5, 6, 7A, and 7B illustrate that the IHS 100 can further include a casing 114 that is laterally sized to closely receive the LWS chassis 102. In one embodiment, the casing 114 has properties to serve as packaging material for shipping without needing additional impact-resistant or void fill material. The casing 114 can also serve a dual purpose as providing support to the LWS chassis 102 at an end user destination. For example, the casing 114 can perform a dual role of providing protection to at least a portion of the IHS 100 after shipping, when the IHS 100 is in functional operation.

Figure 4A:
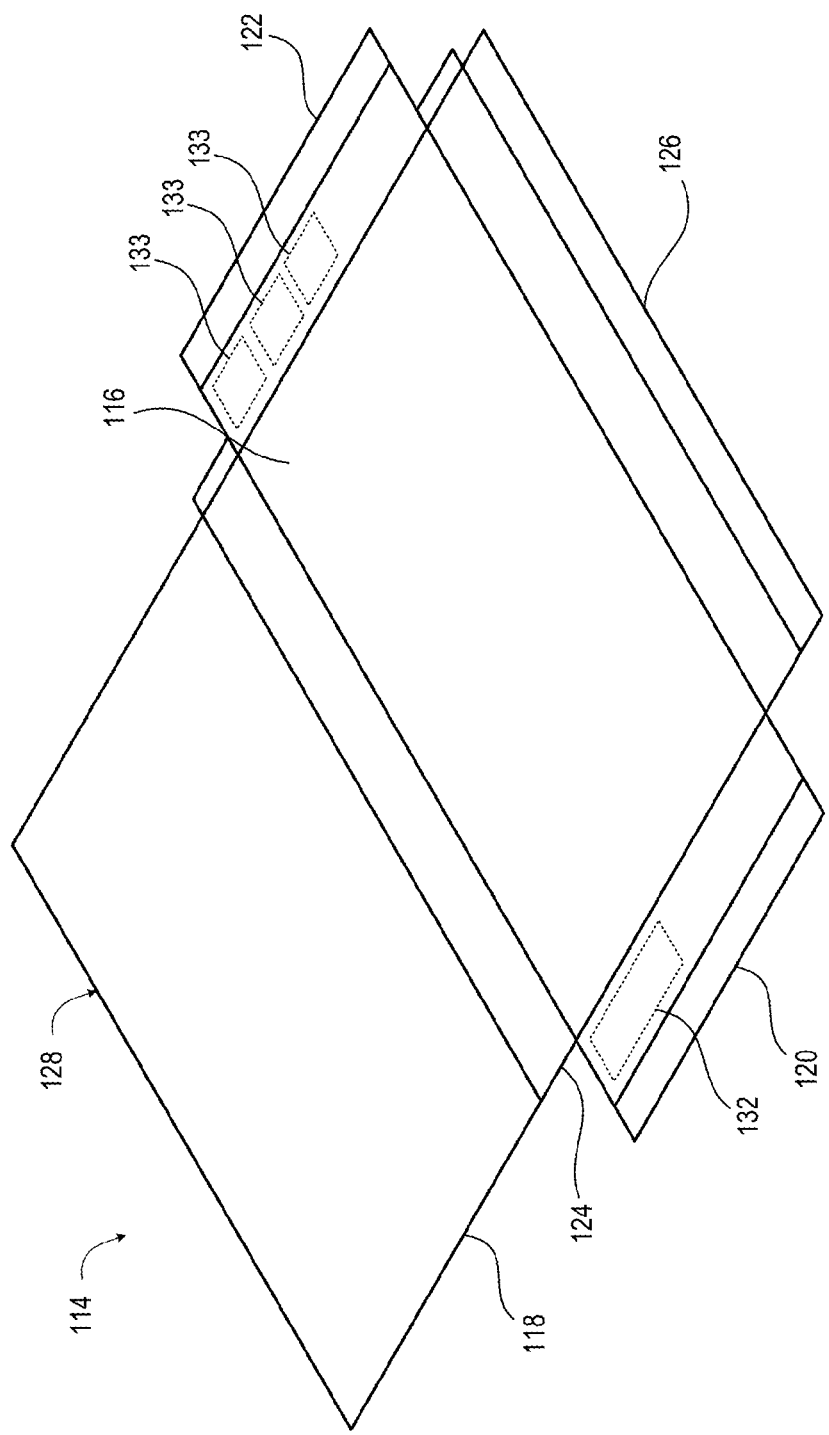
FIG. 4A illustrates an isometric view of a net of an unassembled casing formed of an impact tolerant material, according to one embodiment.

With particular reference to FIG. 4A, in one embodiment the casing 114 includes a base segment 116, a top segment 118, a front segment 120, a back segment 122 and a pair of left and right lateral sides 124, 126 interconnected in a net 128 which forms a cuboid shape 130 (FIG. 7). The casing 114 can be formed from cardboard stock having structural rigidity as well as being impact absorbent material. Prior to sealing the casing 114, one lateral side 124 connects the base segment 116 to the top segment 118. Front segment 120, back segment 122 and one lateral side 126 are initially unattached flaps that can be folded towards each other and/or interconnected to complete the box casing. Each of the segments 116, 118, 120, 122 and lateral sides 124, 126 can formed of an impact tolerant material.

In one embodiment, the casing 114 can be formed from impact tolerant components such as a corrugated laminate. The casing 114 can incorporate biodegradable material such as a cellulose product. The net 128 can facilitate opening up portions for air flow and access, such as by unsealing the front segment 120 and the back segment 122 that are formed as flaps. The casing 114 can further include removable portions 132, 133 that can provide protection during shipment and then be removed after shipping. For example, the removable portions 132, 133 can be formed by perforating the casing 114 or attached by a releasable adhesive. The front removable portion 132 can be registered with communication and power connectors that are subsequently inserted into the casing. The rear removable portions 133 can be registered with exhaust paths from cooling fans that may be received within the casing 114.

Figure 4B:
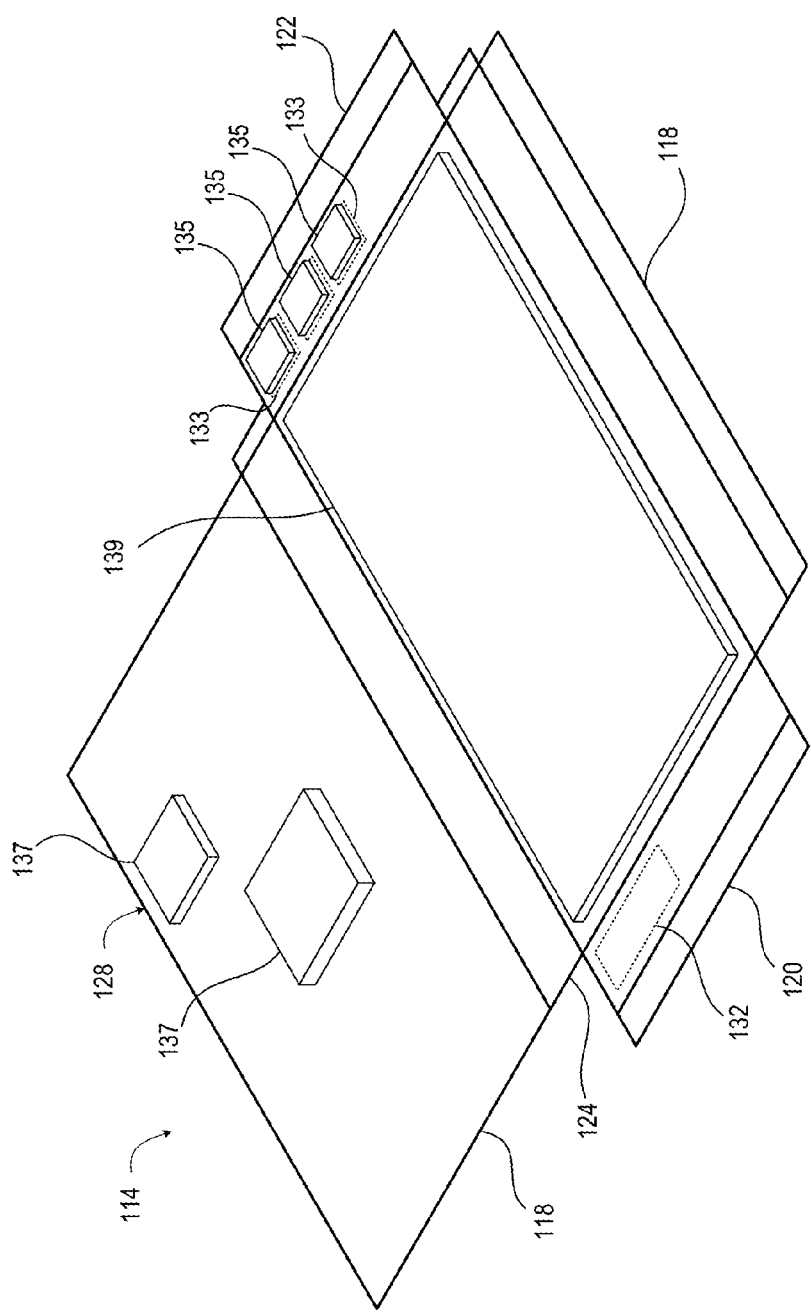
FIG. 4B illustrates an isometric view of a net of an unassembled casing formed of an impact tolerant material and including additional impact tolerant material, according to one embodiment.

In one embodiment in FIG. 4B, the casing 114 is augmented with additional impact tolerant material pads 135, 137, 139 that are attached to an interior surface. For example, each of the additional impact tolerant material pads 135, 137, 139 can serve as void fill to affirmatively hold compute components in place that are received in the casing 114. Examples of impact tolerant materials can include a polyurethane foam, nonwoven synthetic fabric, cardstock formed into a rectoid shape, etc.

In one embodiment, the bottom pad 139 can be tacky or adhesive to hold the LWS chassis 102 in place. Similar adhesive contact can be made between the LWS chassis 102 and/or the compute components 104 with respect to other sides of the casing 114. For example, the casing 114 can be sealed around the LWS chassis 102 after placement. For another example, the LWS chassis 102 with compute components 104 can be sufficiently small for insertion into one side of the casing 114 after being formed into a rectoid with one side open.

Figure 6:
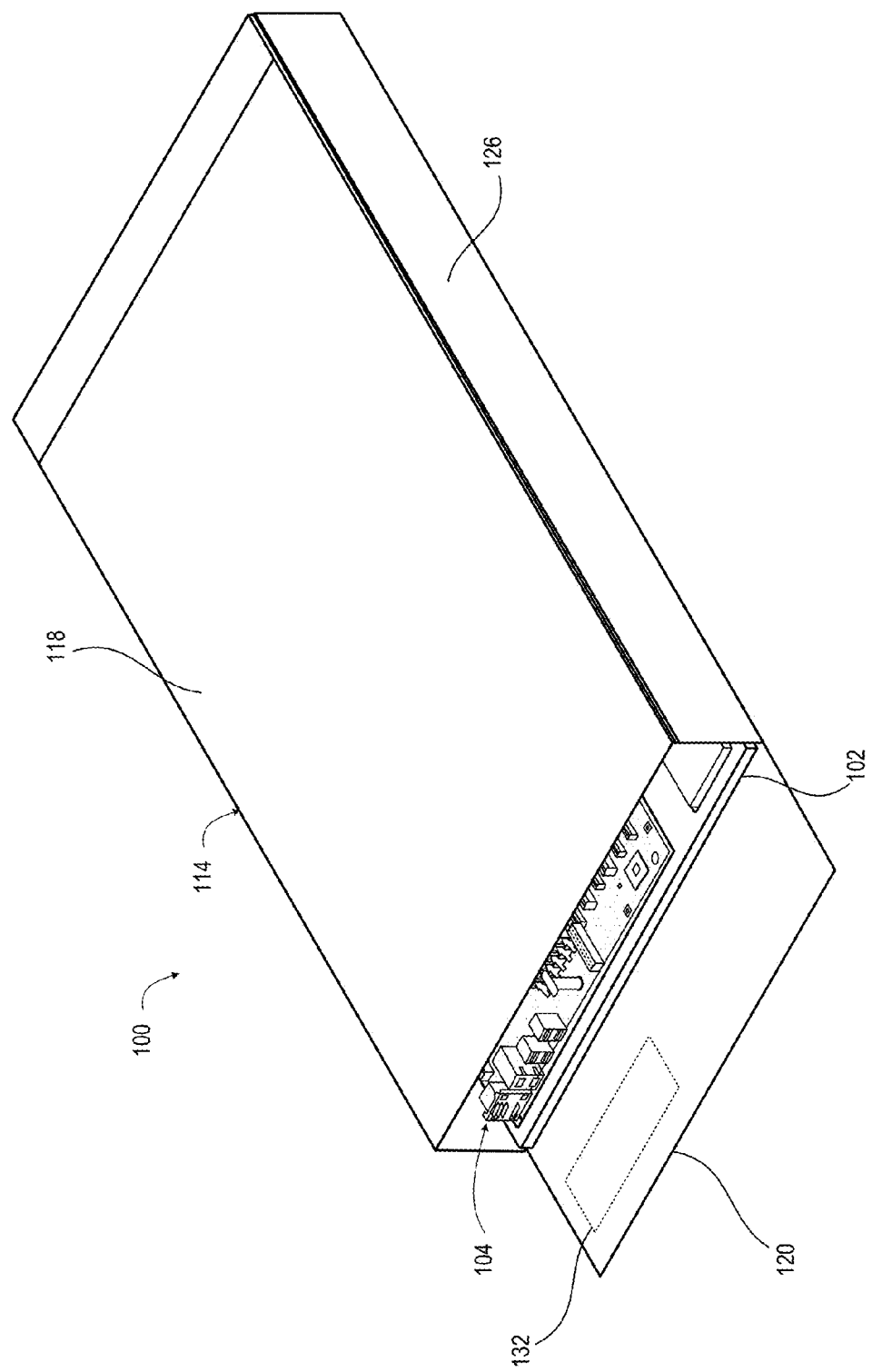
FIG. 6 illustrates an isometric view of the assembled compute components and LWS chassis inserted into an unsealed end of the partially assembled casing of FIG. 5, according to one embodiment.
Figure 7A:
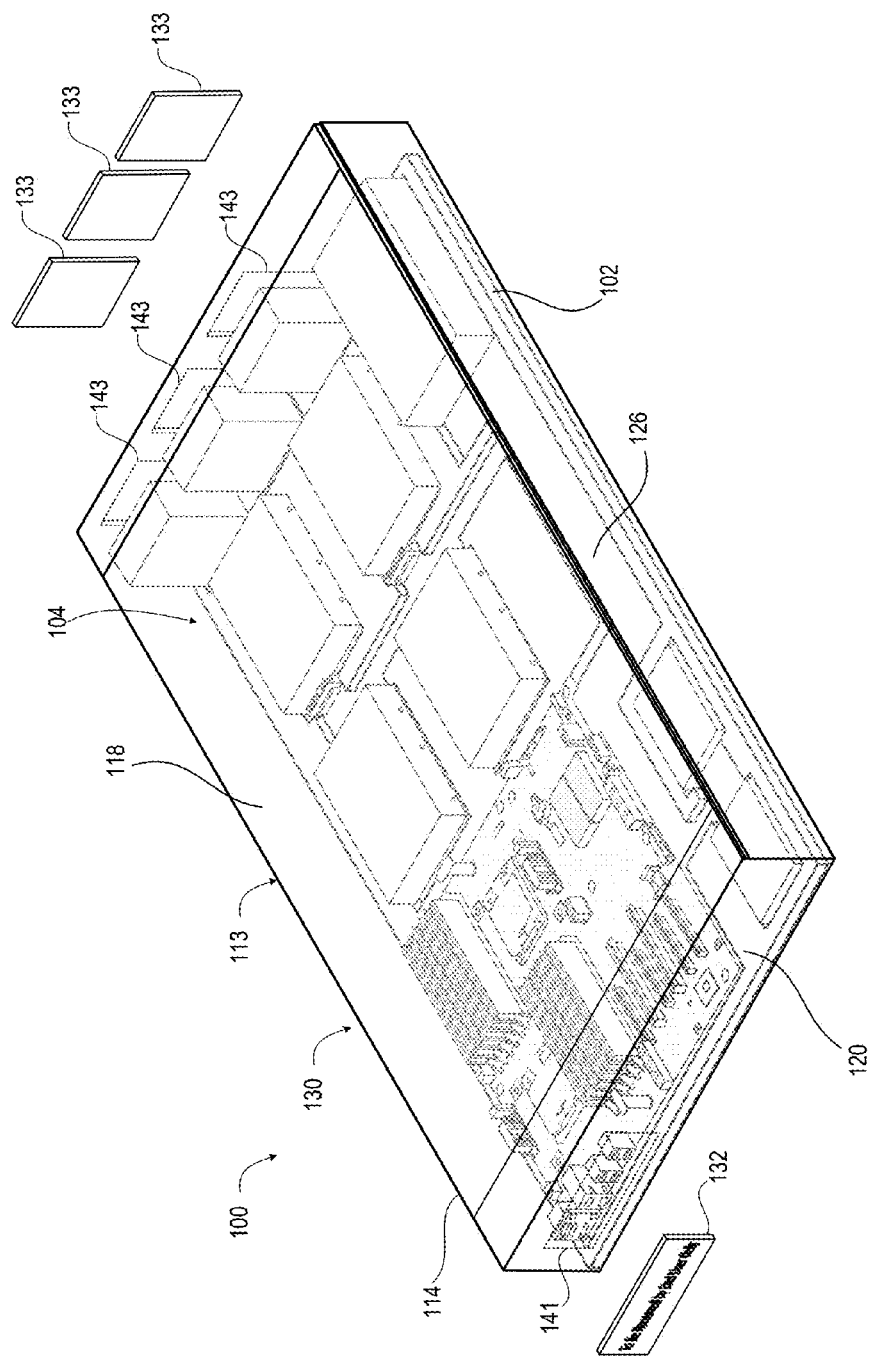
FIG. 7A illustrates an isometric view of a fully assembled casing that includes a removable portions and that protects the inserted LWS chassis and compute components, according to one embodiment.
Figure 7B:
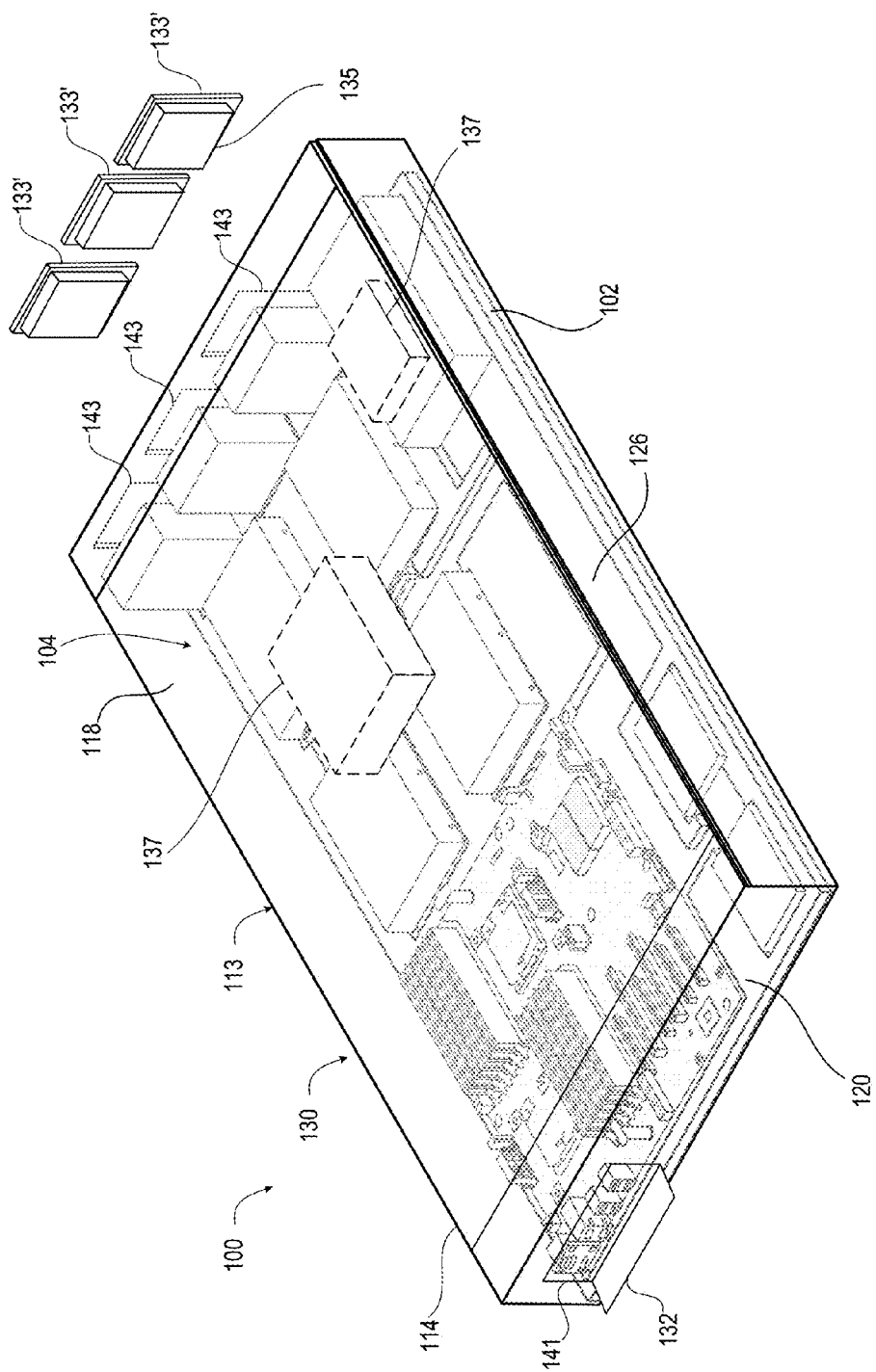
FIG. 7B illustrates an isometric view of a fully assembled casing that includes removable portions and impact tolerant materials and that protects the inserted LWS chassis and compute components, according to one embodiment.

FIG. 5 illustrates the assembled compute components 104 and the LWS chassis 102 of the IHS 100. The casing 114 is partially assembled, with the front segment 120 remaining unsealed to allow insertion of the server chassis. FIG. 6 illustrates the LWS chassis 102 with assembled compute components 104 inserted into an unsealed end of the partially assembled casing 114. FIG. 7A illustrates a fully assembled casing 114 that includes the removable portion 132. Casing 114 protects the inserted LWS chassis 102 and compute components 104. During shipping, the casing 114 can fully encompass the chassis 102 and inserted compute components 104. The casing 114 can provide impact tolerant material that protects the chassis 102 and compute components 104 during shipping. Removable portion 132 of the casing can be an entire surface or a partial surface, depending on the specific implementation. In one embodiment, the removable portions 132, 133 are defined by one or more perforated segments that can be removed. After the encased IHS 100 has been shipped to the end user destination, the removable portions 132, 133 can be removed to respectively leave apertures 141, 143 for exterior access to one or more modular, functional compute components located on the server chassis. For example, the removable portions 132, 133 can provide an access point for power cabling or communication cabling. As another example, the removable portions 132, 133 can provide apertures for required air flow to enter or exit the casing for thermal management of the compute components 104. In one embodiment illustrated by FIG. 7B, the LWS chassis 102 has been augmented with the additional impact tolerant material pads 135, 137. The top pads 137 can further serve by size and placement to define air flow through the casing 114 to focus higher velocity air past higher temperature compute components 104. Thus, the shape of the compute components 104, the casing 114 and the top pads 137 can define an air baffle.

In one embodiment, the casing 114 and/or LWS chassis 102 can be formed of material that is biodegradable for facilitating disposal at end of life of the encased IHS 100. In one embodiment, the casing 114 and/or LWS chassis 102 can incorporate or be selectively coated with material that is flame retardant and heat resistant to mitigate hazards from compute components that can reach high temperatures. In one embodiment, the casing 114 and/or LWS chassis 102 incorporates shielding material for shielding a user from electromagnetic interference (EMI) generated by the modular, functional compute components 104 and shielding the modular functional compute components 104 from electrostatic damage.

Figure 8:
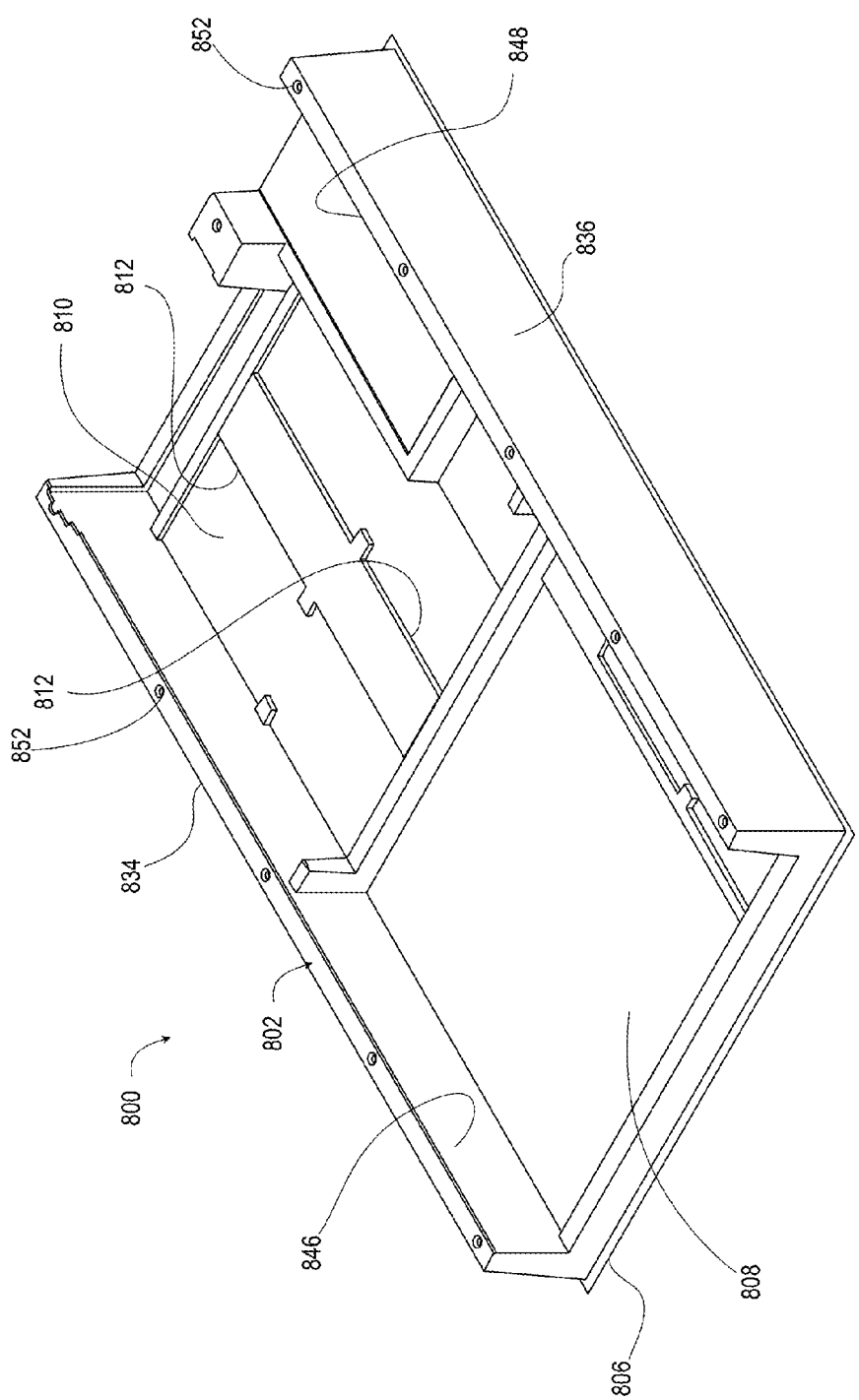
FIG. 8 illustrates an isometric view of a base component of another example LWS chassis having lateral sides and including molded receptacles formed in pliable material, according to one embodiment.
Figure 9:
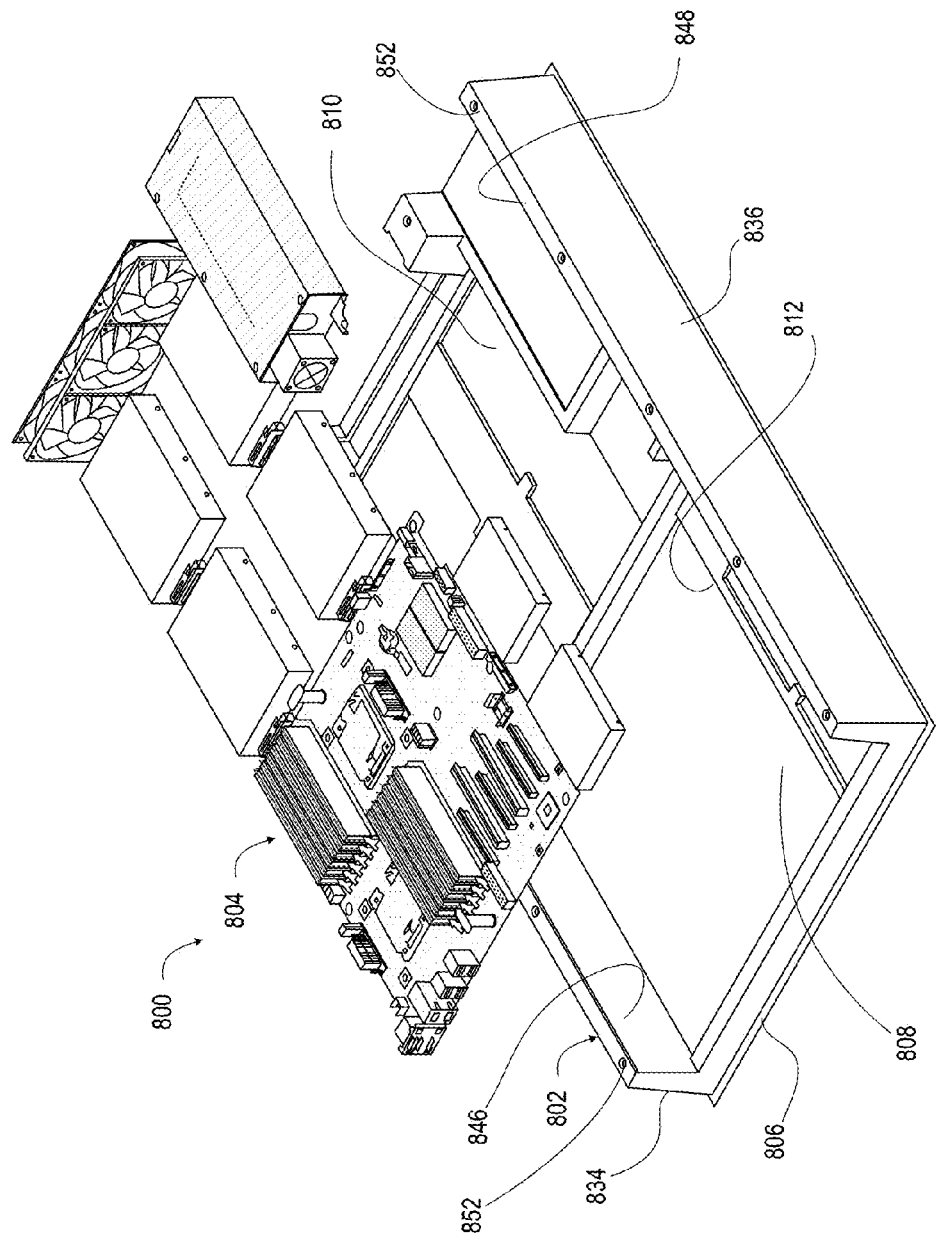
FIG. 9 illustrates an isometric view of the base component of the LWS chassis of FIG. 8 with an exploded view of modular, functional compute components, according to one embodiment.
Figure 10:
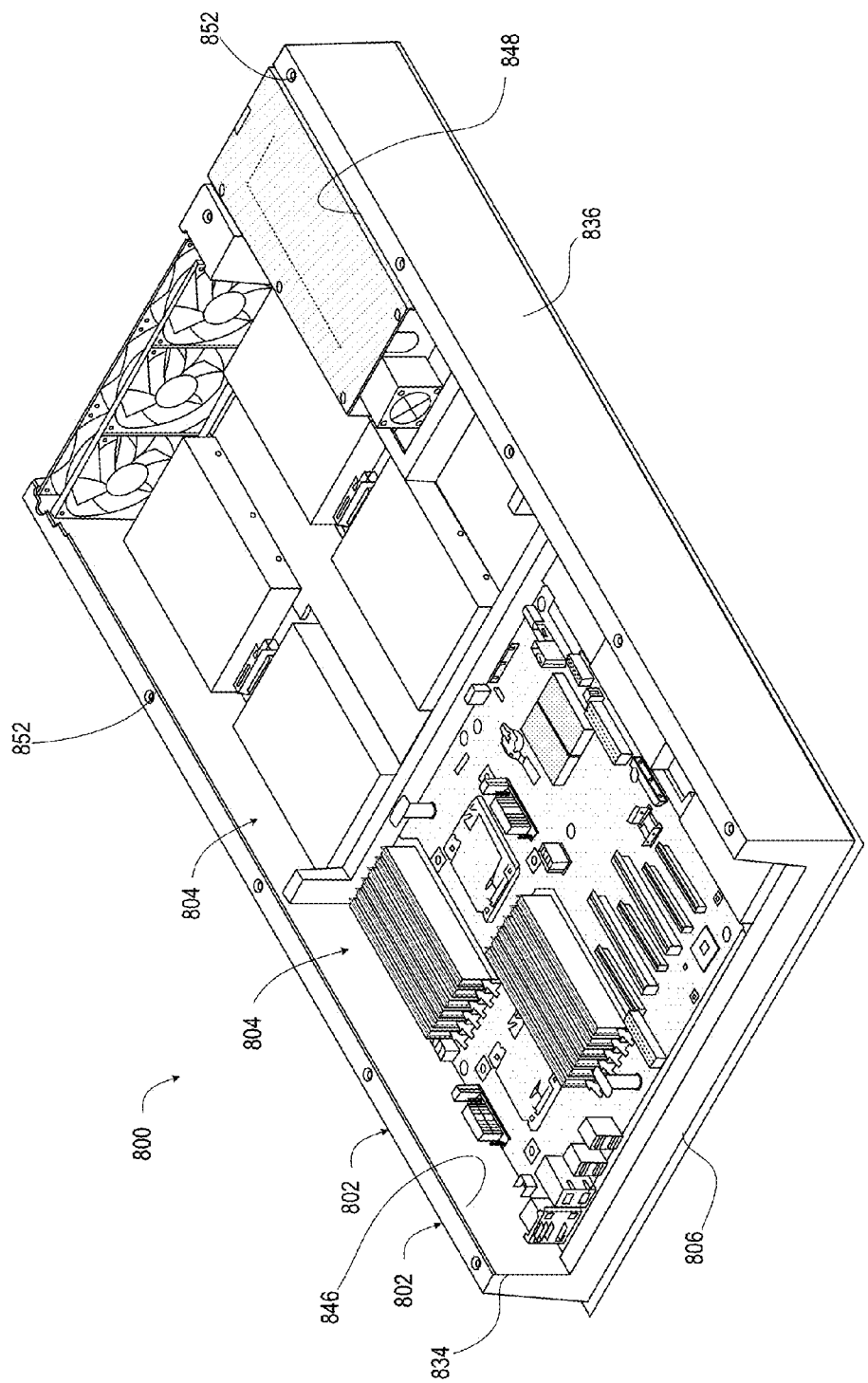
FIG. 10 illustrates an isometric view of the modular, functional compute components engageably received by the base component of the LWS chassis of FIG. 9, according to one embodiment.

FIGS. 8-18 illustrate a portion of an IHS 800 that includes another example lightweight rack server (LWS) chassis 802 that receives modular, functional compute components 804 (FIGS. 8-10). The LWS chassis 802 can serve as a base component 806 of the structural support for these compute components 804 during both shipping of the IHS 800 and utilization at a final end customer/destination. In one embodiment, the LWS chassis 802 has a top surface 808 that includes slots 810 formed therein that are each sized to receive a specific compute component 804 of a plurality of different compute components 804 that when interconnected, collectively provide a fully functional IHS 800. In a particular embodiment, the LWS chassis 802 is formed of a pliable material into which are molded receptacles 812 that define engageable surfaces of the slots 810 presented on the top surface 808 thereof. In one embodiment, the molded receptacles 812 are sized to selectively receive more than one type of compute component 804, thereby providing configurability at either the original equipment manufacturer (OEM) or at a final customer location. With particular reference to FIG. 8, the base component 806 includes attached left and right lateral sides 834, 836. In FIG. 9, the base component 806 exposes the molded receptacles 812 to receive the compute components 804. FIG. 10 illustrates that the left and right lateral sides 834, 836 extend above all of the received compute components 804.

FIGS. 11-18 illustrate a cover component 838 utilized to complete the LWS chassis 802. The cover component 838 mates with the base component 806 to provide a complete enclosure for the compute components 804 and further protect the inserted compute components 804 during either shipping or during operation. In one embodiment, the cover component 838 includes left and right lateral flanged edges 840 to contact a top surface of the left and right lateral sides 834, 836 (FIGS. 8-10) of the chassis 802. The cover component 838 also includes left and right recessed portions 842, 844 that are registered for alignment to respectively contact a respective inward surface 846, 848 of each lateral side 834, 836 of LWS chassis 802. The interconnection between the base component 806 and the cover component 838 thereby provides for a lid enclosure that tends to stay in place. Affixing the cover component 838 to the base component 806 is also facilitated by corresponding a recessed engagement features 850 in the former (FIG. 11) and a projecting engagement feature 852 in the latter (FIG. 10).

Figure 11:
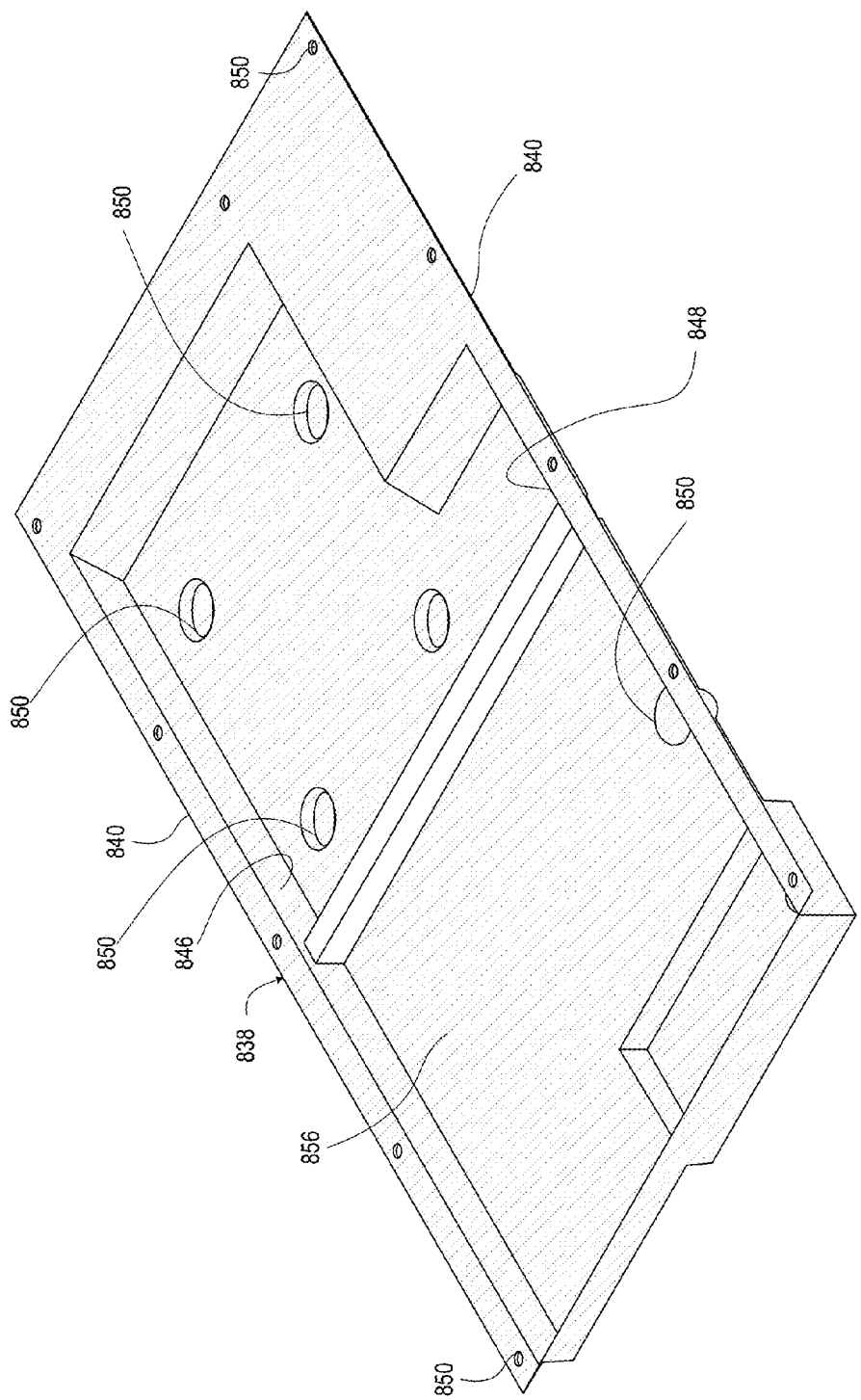
FIG. 11 illustrates an isometric view of a cover component of the LWS chassis of FIG. 8, according to one embodiment.
Figure 12:
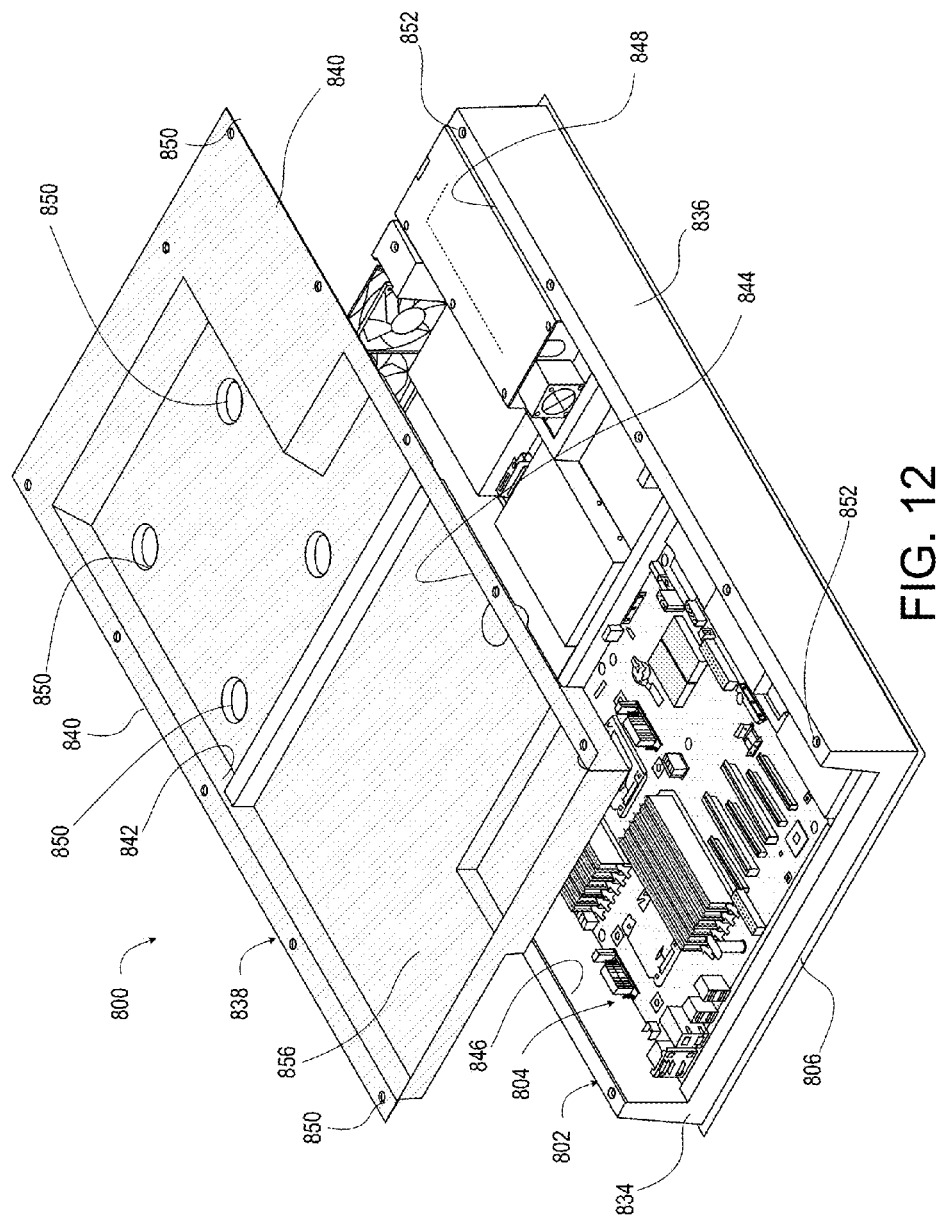
FIG. 12 illustrates an isometric view of the modular, functional compute components engageably received by the base component of the LWS chassis of FIG. 10 and an exploded view of the cover component of FIG. 11, according to one embodiment.
Figure 13:
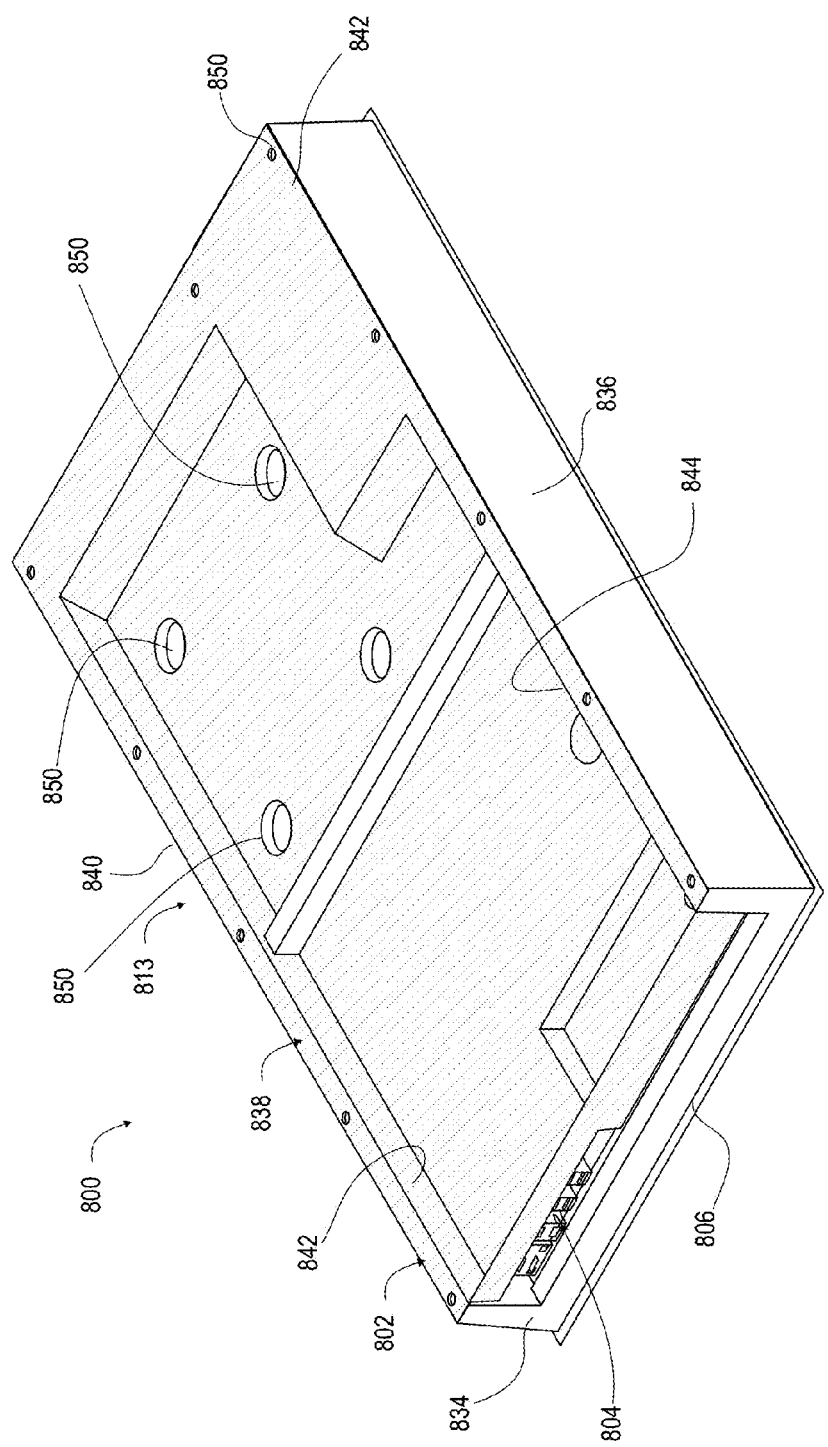
FIG. 13 illustrates an isometric view of the modular, functional compute components engageably received by the base component and enclosed by the cover component of the LWS chassis of FIG. 12, according to one embodiment.
Figure 14:
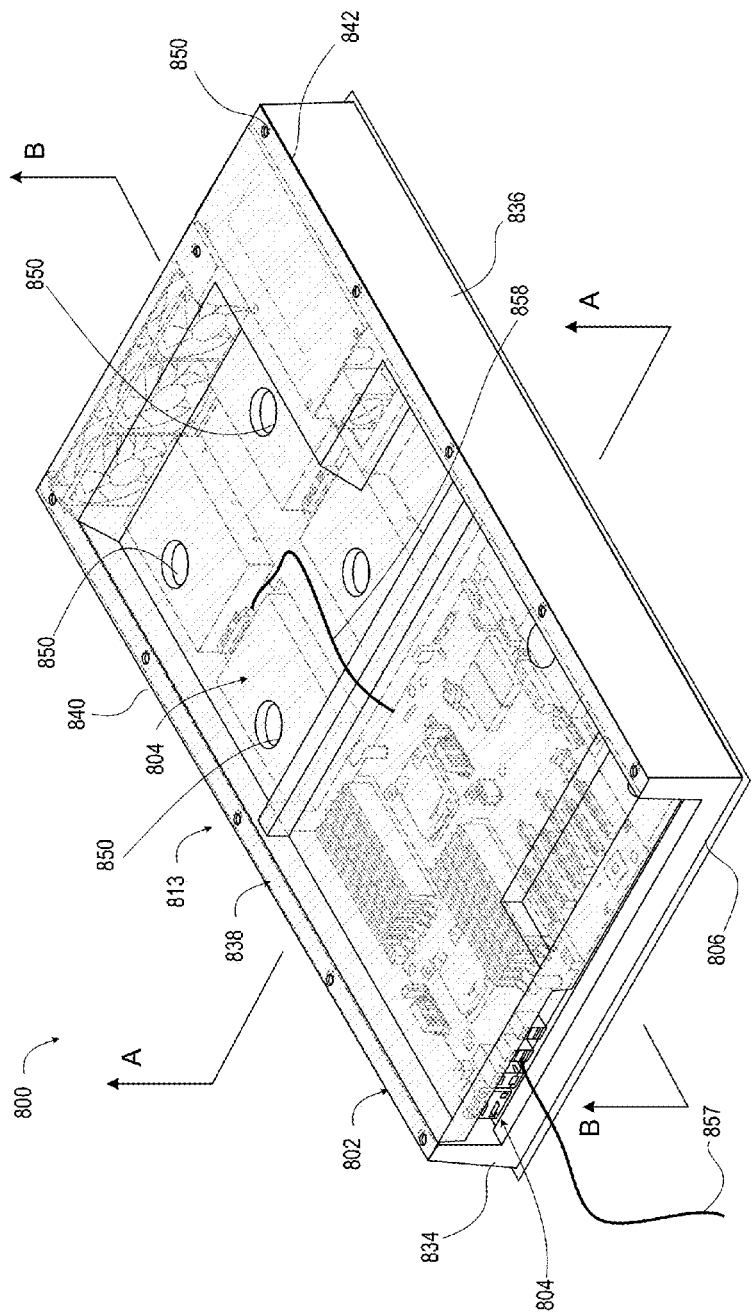
FIG. 14 illustrates an isometric view of the rack server of FIG. 13 with of the modular, functional compute components visible through the enclosed cover component, according to one embodiment.
Figure 15:
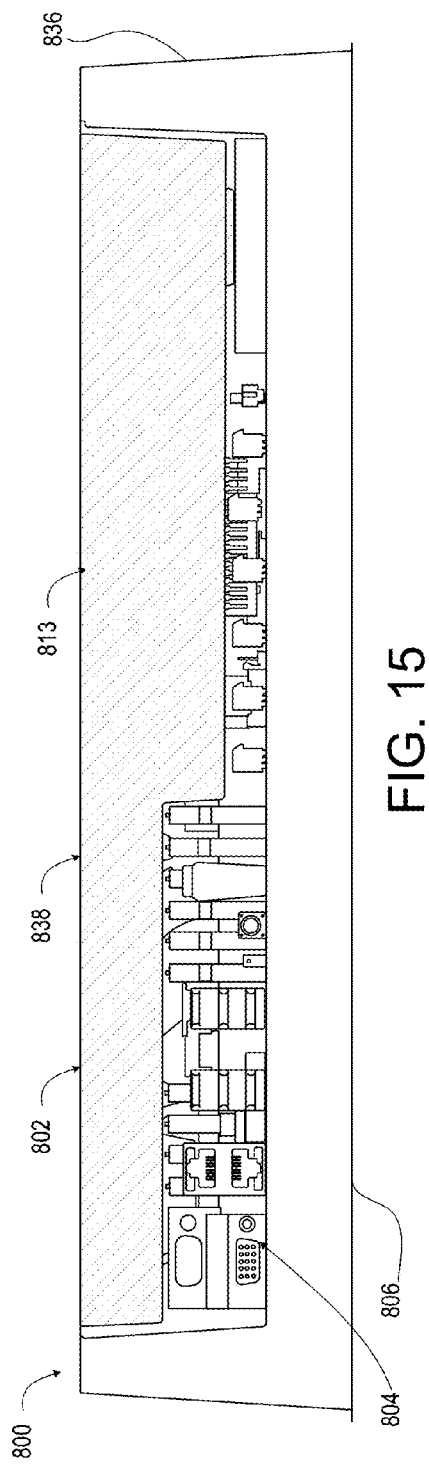
FIG. 15 illustrates a front side view of the rack server of FIG. 13, according to one embodiment.
Figure 16:
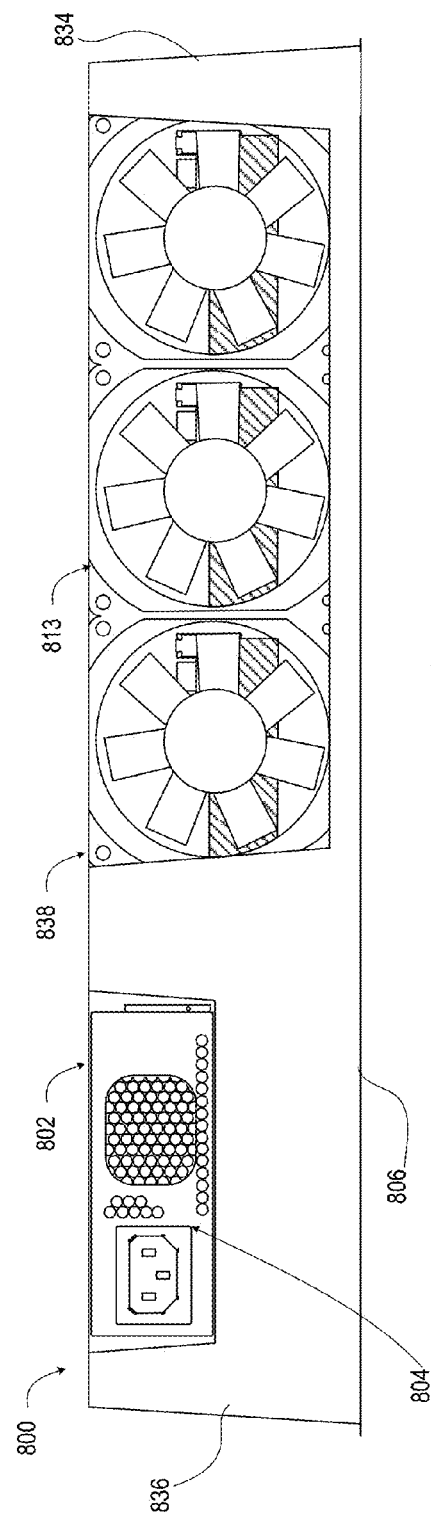
FIG. 16 illustrates a rear side view of the rack server of FIG. 13, according to one embodiment.

FIG. 11 illustrates the cover component 838 of the LWS chassis 802, according to one embodiment. FIG. 12 illustrates the modular, functional compute components 804 engageably received by the base component 806 of the LWS chassis 802. In FIG. 12, the cover component 838 is disassembled from the base component 806. FIG. 13 illustrates the modular, functional compute components 804 engageably received by the base component 806 and enclosed by the cover component 838 of the LWS chassis 802 to form a rack server 813 capable of being utilized as one functional server component of a rack-based IHS 800, according to one embodiment. FIG. 14 illustrates an assembled rack server 813 (FIG. 13) which includes power cabling and communication cabling to enable rack server 813 to operate as at least a portion of an IHS 800. FIG. 15 illustrates a front side view of the rack server 813, according to one embodiment. FIG. 16 illustrates a rear side view of the rack server 813, according to one embodiment.

Figure 17:
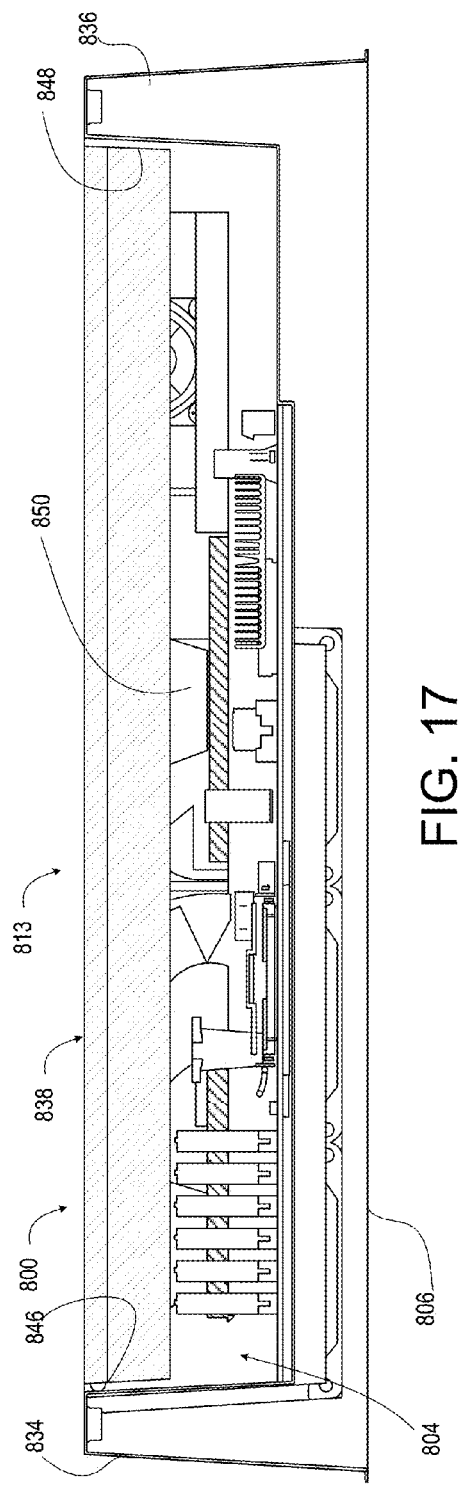
FIG. 17 illustrates a front side view cutaway along lines A-A of FIG. 14, according to one embodiment.
Figure 18:
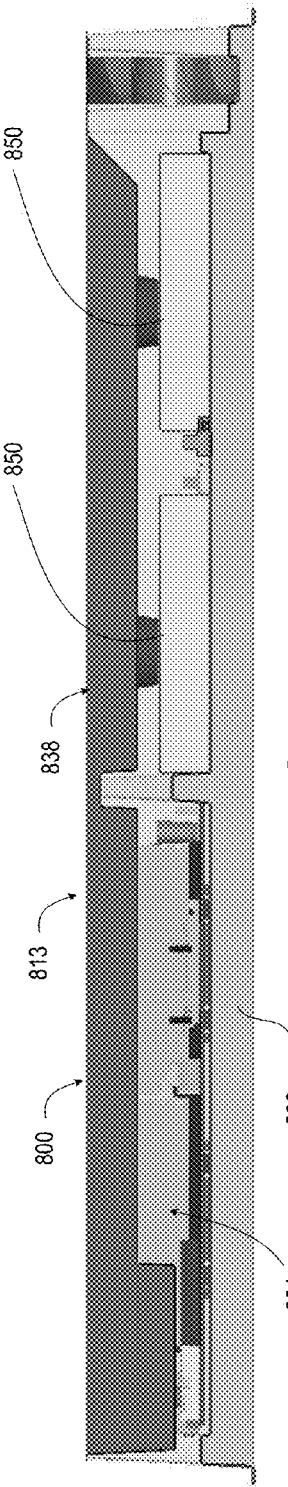
FIG. 18 illustrates a right side view cutaway along lines B-B of FIG. 15, according to one embodiment.

In one or more embodiments, as illustrated by FIGS. 14 and 17-18, cover component 838 includes downward projections 850 to opposingly contact a selected inserted modular, functional compute component 804 and which serve as one or both of a void filler and for shock mounting. FIG. 17 illustrates a front side view cutaway along lines A-A of FIG. 14 to show the downward projections 850. FIG. 18 illustrates a right side view cutaway along lines B-B of FIG. 14 to also show the downward projections 850, according to one embodiment. According to one aspect of the disclosure, the cover component 838 is configured to also balance the area devoted to downward projections 850 with non-contacting portions to serve as an air flow baffle 856 (FIG. 12) which directs air flow across selected functional components 804 when inserted and/or operational within the LWS chassis 802. External cabling 857 and internal cabling 858 can be connected to the compute components 804 to create a functional IHS 800. For clarity, only two connections are depicted, although it should be appreciated that numerous separate cables or cables integral to the LWS chassis 802 can be installed to provide the necessary power and communication connections for the compute components 804.

FIGS. 19-20 illustrate an example rack server 1913 for an IHS 1900 that has a LWS chassis 1902 with a cover component 1938 that laterally overlaps left and right lateral sides 1934, 1936 of a base component 1906 of the server chassis 1902. Specifically, FIG. 19 illustrates a front isometric view of the example rack server 1913 and FIG. 20 illustrates a rear isometric view of the example rack server 1913.

Figures 21, 22:
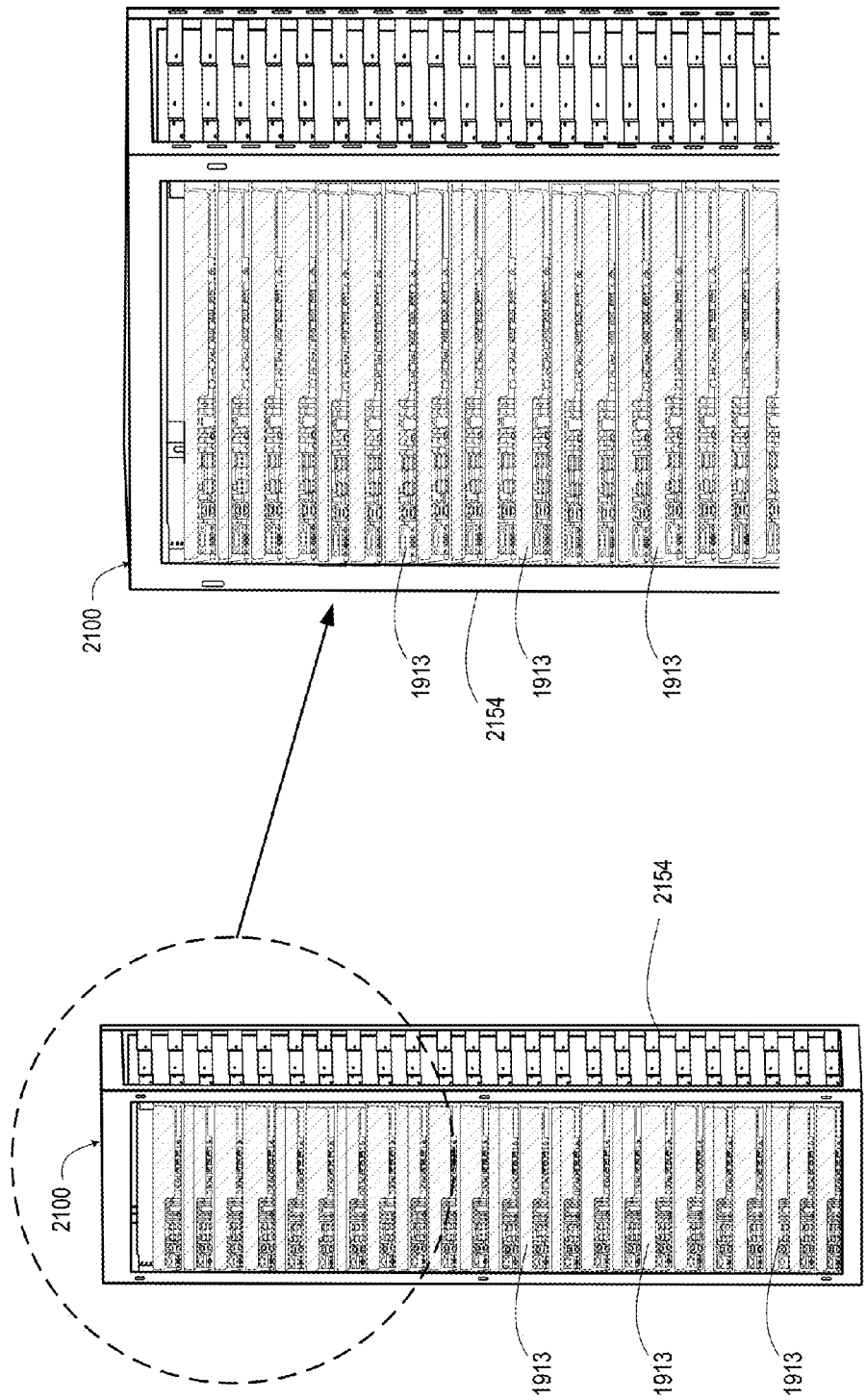
FIG. 21 illustrates a front side view of rack servers of FIG. 13 mounted in a rack, according to one embodiment.
FIG. 22 illustrates a detail front side view of the IHS of FIG. 21, according to one embodiment.
Figures 23, 24:
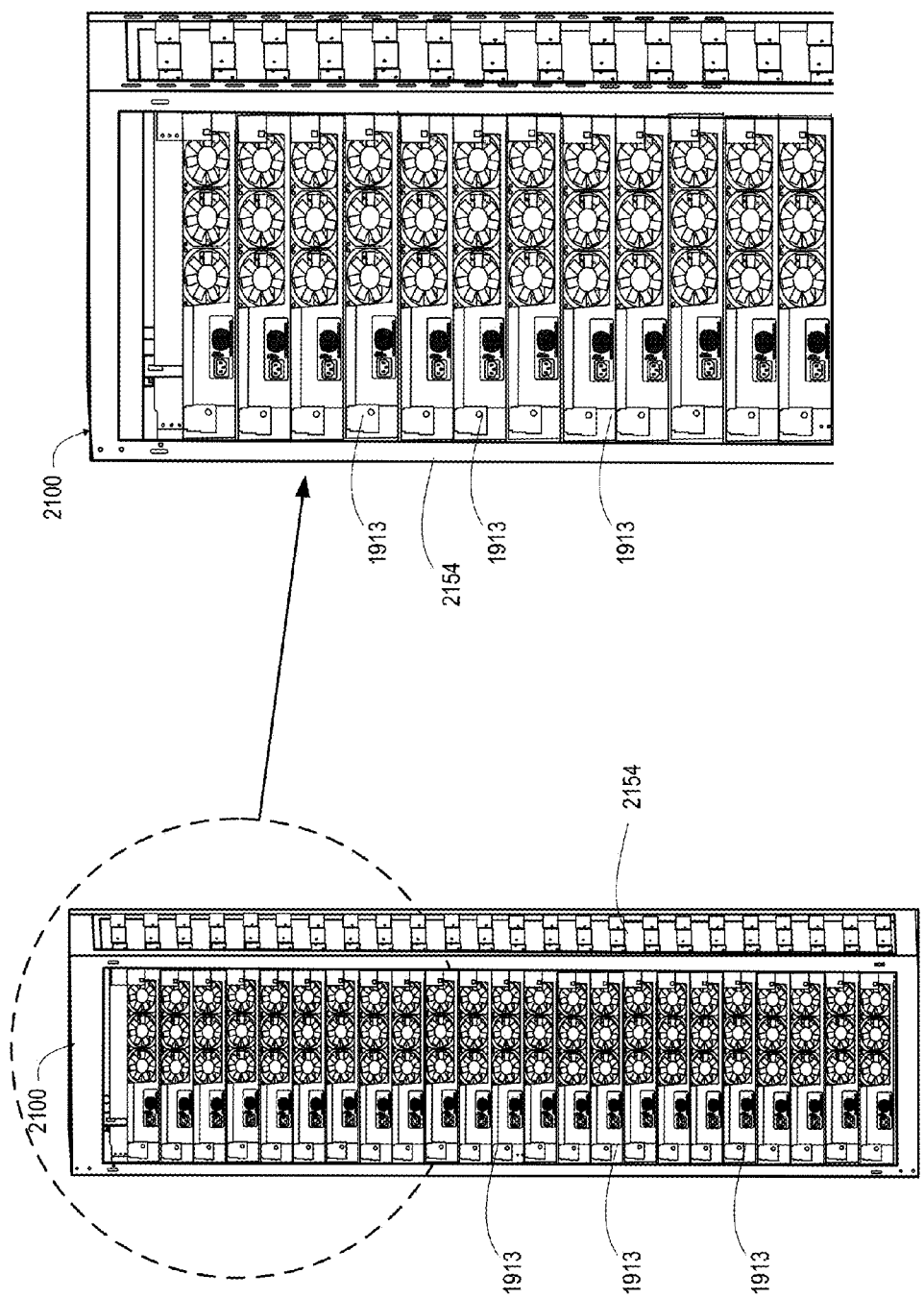
FIG. 23 illustrates a rear side view of the IHS of FIG. 21, according to one embodiment.
FIG. 24 illustrates a detail rear side view of the IHS of FIG. 23, according to one embodiment.

FIGS. 21-24 illustrate an example IHS 2100 having a rack frame 2154 in which are mounted a plurality of the example rack servers 1913. In particular, FIG. 21 illustrates a front side view of an IHS 2100 comprised of rack servers 1913 mounted in a rack frame 2154. FIG. 22 illustrates a detailed front side view of the IHS 2100 of FIG. 21. FIG. 23 illustrates a rear side view of the IHS 2100. FIG. 24 illustrates a detailed rear side view of the IHS 2100.

Figure 25:
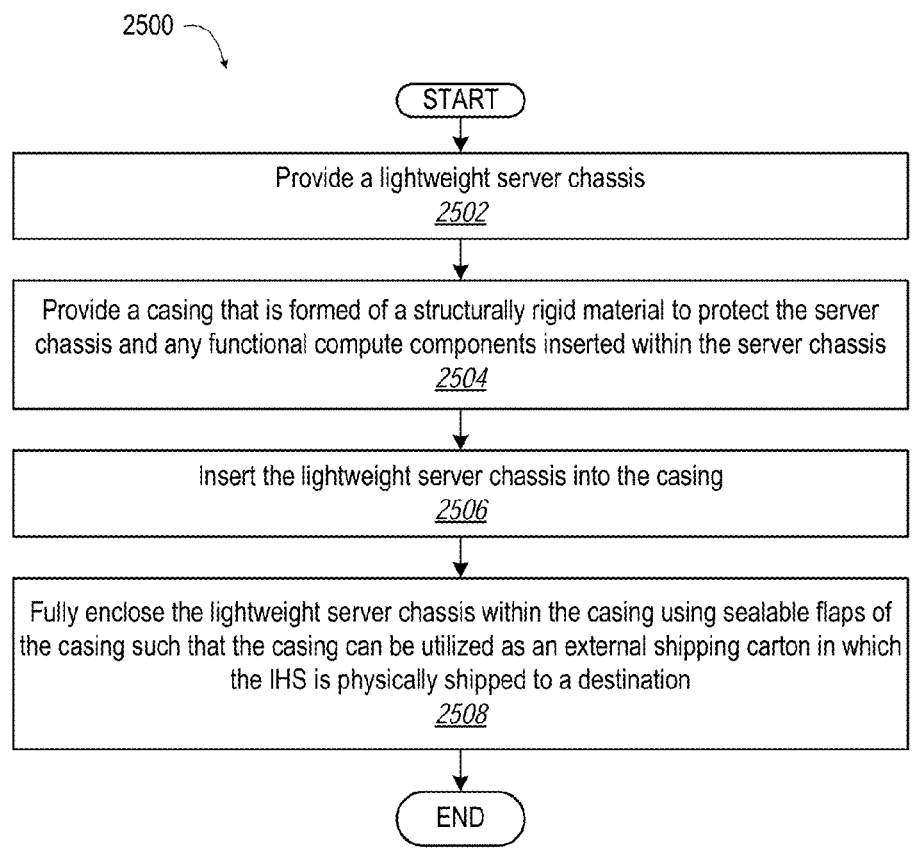
FIG. 25 illustrates a flow diagram of a method for shipping and structurally supporting a functional IHS, according to one embodiment.

FIG. 25 illustrates a method 2500 for structurally protecting an IHS for both shipment and operation. In the illustrative embodiment, the method 2500 includes providing a LWS chassis (block 2502). In block 2504, the method 2500 includes providing a casing that is formed of a structurally rigid material to protect the server chassis and any functional compute components inserted within the server chassis. The method 2500 includes inserting the LWS chassis into the casing (block 2506). The method 2500 includes fully enclosing the LWS chassis within the casing using sealable flaps of the casing such that the casing can be utilized as an external shipping carton in which the IHS is physically shipped to a destination (block 2508).

Figure 26:
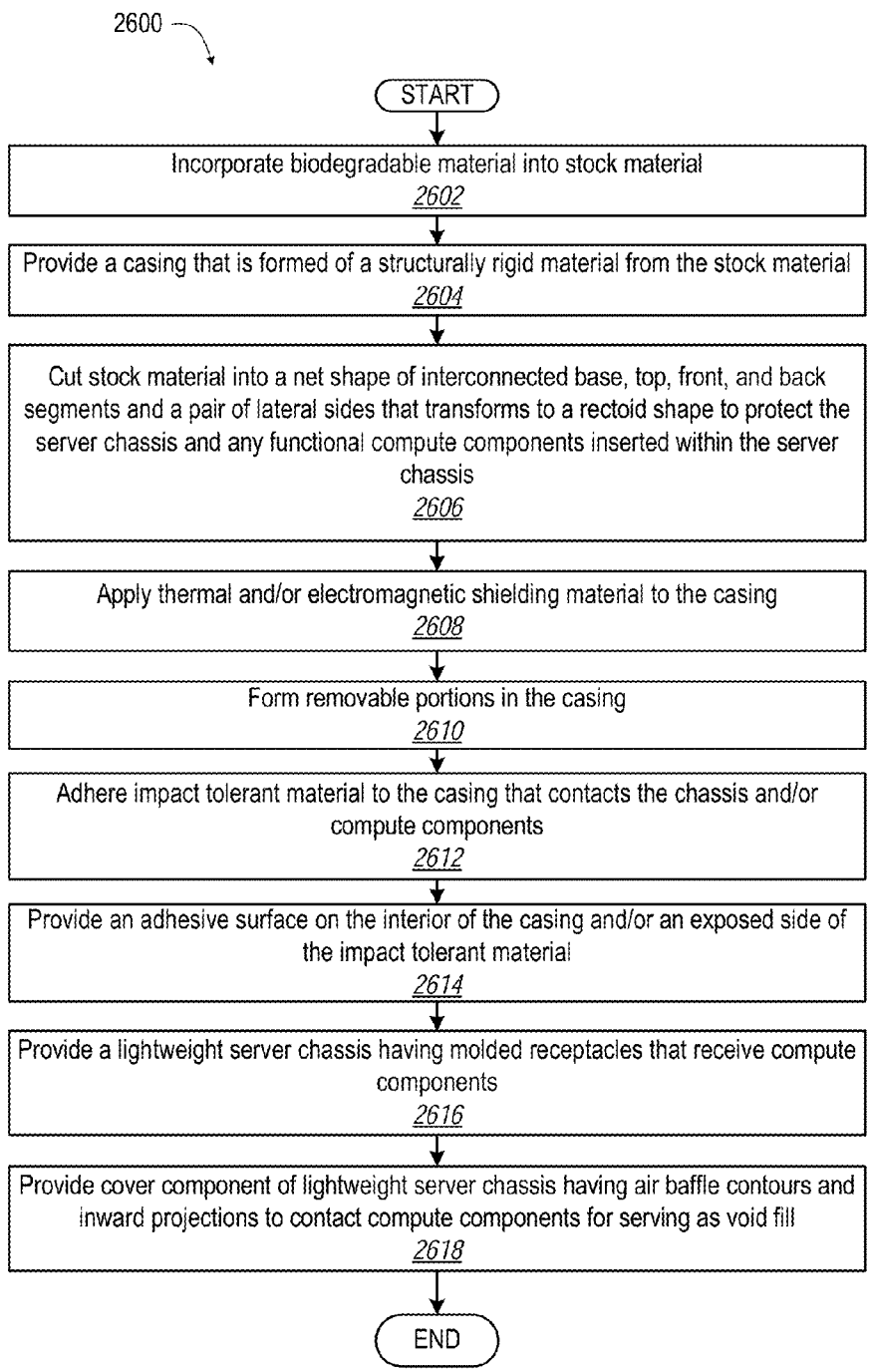
FIG. 26 illustrates a flow diagram for providing a casing and LWS chassis, according to one embodiment.

FIG. 26 illustrates an exemplary method 2600 for providing the chassis and casing for the method 2500 (FIG. 25). In one embodiment, the method 2600 includes manufacturing at least a portion of casing from biodegradable material (block 2602). The method 2600 includes forming a casing of a structurally rigid material (block 2604). For example, stock material made of organic material can be inherently biodegradable and can also be inherently impact tolerant. Fabricating a corrugated structure can increase the impact tolerance. The method 2600 includes cutting the stock material into a net shape of interconnected base, top, front, and back segments and a pair of lateral sides that transforms into a rectoid shape to protect the server chassis and any functional compute components inserted within the server chassis (block 2606). In an illustrative embodiment, method 2600 includes applying thermal and/or electromagnetic shielding material to the casing (block 2608).

In one embodiment, providing the casing includes providing a removable portion of the casing that provides impact tolerant material during shipping. The removable portion further enables exterior access to one or more modular, functional compute components located on the chassis by removal of the removable portion after shipping. In one particular embodiment, the method 2600 includes providing the removable segments by forming perforated segments in the casing that can be removed after shipping of the IHS (block 2610). In an illustrative embodiment, the method 2600 further includes adhering impact tolerant materials to the casing that contact the chassis and/or the compute components to serve purposes such as void fill (block 2612). In a particular embodiment, the method 2600 further includes providing an adhesive surface on the interior of the casing and/or an exposed side of the impact tolerant material to maintain the contents of the casing in position (block 2614).

With the casing provided, the method 2600 can further include providing a LWS chassis having molded receptacles that receive compute components (block 2616). In some embodiments, the method 2600 can further include providing a cover component of the LWS chassis that has air baffle contours to control air flow for cooling and that has downward projections to contact compute components to serve as voice fill (block 2618).

One or more automated processes can produce at least a portion of casing. For example, cardboard stock can be impregnated, coated, or adhesively adhered to with material having thermal protective properties or electromagnetic shielding properties. To economically proportion such materials, only specific areas requiring such treatments can be targeted. The cardboard stock can be conveyed to a cutting die machine to automatically cut the cardboard stock into a net shape. Flaps of the net can be crimped at the ended fold point. Removal portions can be stamped out. Impact tolerant material in the form of pads or layers can be adhered to portions of the net shape. Similarly, one or more automated processes can produce a chassis. For example, a pliable material can be stamped or vacuum molded into a bottom and/or a cover shape. Examples of pliable material include a thermal polymers, epoxy resins, etc. Such materials can also be used to provide structural rigidity to a filler component such as textile fibers.

Figure 27:
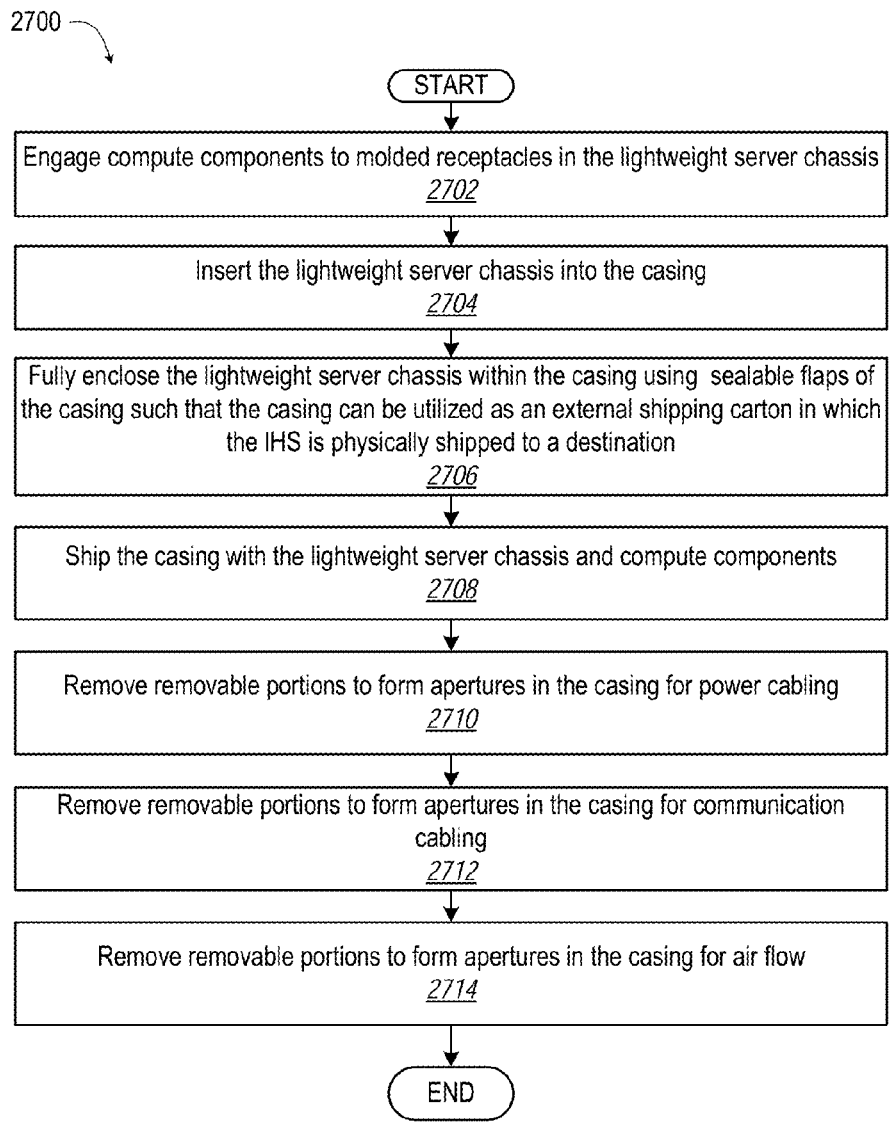
FIG. 27 illustrates a flow diagram of using the casing and LWS chassis provided by the method of FIG. 26, according to one embodiment.

FIG. 27 illustrates a method of using the casing and chassis provided by method 2600 (FIG. 26). In one embodiment, the method 2700 includes engaging compute components into the molded receptacles in the LWS chassis (block 2702). Method 2700 further includes inserting the LWS chassis into the casing (block 2704). Method 2700 further includes fully enclosing the LWS chassis within the casing using sealable flaps of the casing such that the casing can be utilized as an external shipping carton in which the IHS is physically shipped to a destination (block 2708). In one embodiment, the method 2700 includes shipping the casing with the LWS chassis and compute components inserted therein (block 2708). For example, the method 2700 may further include providing a selected removable portion by providing a required opening for power cabling (block 2710). As another example, the method 2700 may further include providing a selected removable portion by providing a required opening for communication cabling (block 2712). As yet another example, the method 2700 may further include providing a selected removable portion by providing a required opening for air flow (block 2714).

In the above described flow charts of FIG. 25-27, one or more of the methods may be embodied in an automated manufacturing system that performs a series of functional processes. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. An information handling system (IHS) comprising: a lightweight server (LWS) chassis; and a casing in which the lightweight server chassis is inserted, the casing (i) designed to be utilized as both the exterior casing of the LWS chassis and an external shipping carton for physically shipping the IHS to a destination and (ii) formed of a structurally rigid material to protect the server chassis and any functional compute components inserted within the server chassis, wherein the casing comprises sealable flaps that enable the server chassis to be fully enclosed within the casing and the casing is sized to closely receive the server chassis to prevent relative movement of the server chassis within the casing.

2. The IHS of claim 1, wherein the chassis is adhesively attached to the casing.

3. The IHS of claim 1, wherein the casing further comprises impact tolerant material.

4. The IHS of claim 1, wherein the casing comprises a removable portion that encloses the chassis and compute components during shipping and enables exterior access to one or more modular, functional compute components located on the chassis by removal of the removable portion after shipping.

5. The IHS of claim 4, wherein the casing further comprises perforated segments that can be removed after shipping of the IHS.

6. The IHS of claim 4, wherein a selected removable portion provides a required opening for power cabling.

7. The IHS of claim 4, wherein a selected removable portion provides a required opening for communication cabling.

8. The IHS of claim 4, wherein a selected removable portion provides a required opening for air flow.

9. The IHS of claim 1, wherein the casing comprises biodegradable material.

10. The IHS of claim 1, wherein the casing comprises a base segment, a top segment, a front segment, a back segment and a pair of lateral sides interconnected in a net for forming into a cuboid and formed of an impact tolerant material.

11. The IHS of claim 1, wherein the LWS chassis comprises at least one molded receptacle to engageably receive a selected modular, functional compute component.

12. The IHS of claim 1, wherein the casing comprises shielding material for shielding a user from electromagnetic interference (EMI) generated by the modular, functional compute components and shielding the modular, functional compute components from electrostatic damage.

* * * * *